United States Patent
Panchawagh et al.

(10) Patent No.: US 10,497,748 B2
(45) Date of Patent: Dec. 3, 2019

(54) INTEGRATED PIEZOELECTRIC MICROMECHANICAL ULTRASONIC TRANSDUCER PIXEL AND ARRAY

(71) Applicant: QUALCOMM Incorporated, San Diego, CA (US)

(72) Inventors: Hrishikesh Vijaykumar Panchawagh, Cupertino, CA (US); Suryaprakash Ganti, Los Altos, CA (US); Kostadin Dimitrov Djordjev, San Jose, CA (US); David William Burns, San Jose, CA (US); Timothy Alan Dickinson, Carlsbad, CA (US); Donald William Kidwell, Jr., Los Gatos, CA (US); Ravindra Vaman Shenoy, Dublin, CA (US); Jon Bradley Lasiter, Stockton, CA (US); Hao-Yen Tang, Berkeley, CA (US); Yipeng Lu, Davis, CA (US)

(73) Assignee: QUALCOMM Incorporated, San Diego, CA (US)

( * ) Notice: Subject to any disclaimer, the term of this patent is extended or adjusted under 35 U.S.C. 154(b) by 106 days.

(21) Appl. No.: 15/292,057

(22) Filed: Oct. 12, 2016

(65) Prior Publication Data

US 2017/0110504 A1 Apr. 20, 2017

Related U.S. Application Data

(60) Provisional application No. 62/241,651, filed on Oct. 14, 2015.

(51) Int. Cl.
*H01L 27/20* (2006.01)
*H01L 27/12* (2006.01)
(Continued)

(52) U.S. Cl.
CPC ............ *H01L 27/20* (2013.01); *B06B 1/0207* (2013.01); *B06B 1/0607* (2013.01);
(Continued)

(58) Field of Classification Search
CPC ... H01L 27/20; H01L 27/1214; H01L 41/311; H01L 41/1132; B06B 1/0607;
(Continued)

(56) References Cited

U.S. PATENT DOCUMENTS

| 3,800,270 A | 3/1974 | Bailey |
| 4,307,613 A | 12/1981 | Fox |

(Continued)

FOREIGN PATENT DOCUMENTS

| CN | 102143422 A | 8/2011 | |
| CN | 108140115 A | * 6/2018 | ............. H01L 27/20 |

(Continued)

OTHER PUBLICATIONS

Second Written Opinion of the International Preliminary Examining Authority—PCT/US2015/055825—ISA/EPO—dated Sep. 26, 2016.
(Continued)

*Primary Examiner* — Daniel Pihulic
(74) *Attorney, Agent, or Firm* — Weaver Austin Villeneuve & Sampson LLP/Qualcomm Incorporated

(57) ABSTRACT

An ultrasonic sensor pixel includes a substrate, a piezoelectric micromechanical ultrasonic transducer (PMUT) and a sensor pixel circuit. The PMUT includes a piezoelectric layer stack including a piezoelectric layer disposed over a cavity, the cavity being disposed between the piezoelectric layer stack and the substrate, a reference electrode disposed between the piezoelectric layer and the cavity, and one or both of a receive electrode and a transmit electrode disposed on or proximate to a first surface of the piezoelectric layer, the first surface being opposite from the cavity. The sensor
(Continued)

pixel circuit is electrically coupled with one or more of the reference electrode, the receive electrode and the transmit electrode and the PMUT and the sensor pixel circuit are integrated with the sensor pixel circuit on the substrate.

30 Claims, 28 Drawing Sheets

(51) Int. Cl.

| | | |
|---|---|---|
| H01L 41/113 | (2006.01) | |
| H01L 41/311 | (2013.01) | |
| G06F 3/043 | (2006.01) | |
| G01S 7/52 | (2006.01) | |
| G06K 9/00 | (2006.01) | |
| B06B 1/02 | (2006.01) | |
| B06B 1/06 | (2006.01) | |

(52) U.S. Cl.
CPC ........ *G01S 7/52028* (2013.01); *G06F 3/0436* (2013.01); *G06K 9/0002* (2013.01); *H01L 27/1214* (2013.01); *H01L 41/311* (2013.01)

(58) Field of Classification Search
CPC ... B06B 1/0207; G06K 9/0002; G06F 3/0436; G01S 7/52028
See application file for complete search history.

(56) References Cited

U.S. PATENT DOCUMENTS

| | | | |
|---|---|---|---|
| 4,523,471 A | 6/1985 | Lee | |
| 5,744,898 A | 4/1998 | Smith et al. | |
| 6,383,141 B1 | 5/2002 | Itoi | |
| 6,736,779 B1 | 5/2004 | Sano et al. | |
| 6,736,799 B1 | 5/2004 | Erbe et al. | |
| 8,203,912 B2 | 6/2012 | Roest et al. | |
| 8,760,971 B2 | 6/2014 | Karl | |
| 8,958,610 B2 | 2/2015 | McNulty | |
| 9,995,821 B2* | 6/2018 | Tang | G06F 3/043 |
| 10,001,552 B2* | 6/2018 | Panchawagh | H01L 41/08 |
| 10,139,479 B2 | 11/2018 | Lu et al. | |
| 2004/0267134 A1 | 12/2004 | Hossack et al. | |
| 2005/0023937 A1 | 2/2005 | Sashida et al. | |
| 2005/0041498 A1 | 2/2005 | Resta et al. | |
| 2005/0057284 A1 | 3/2005 | Wodnicki | |
| 2005/0075572 A1 | 4/2005 | Mills et al. | |
| 2005/0146247 A1 | 7/2005 | Fisher et al. | |
| 2005/0219212 A1 | 10/2005 | Koll et al. | |
| 2006/0164919 A1 | 7/2006 | Watanabe et al. | |
| 2008/0110266 A1 | 5/2008 | Randall et al. | |
| 2008/0122317 A1 | 5/2008 | Fazzio et al. | |
| 2008/0258580 A1 | 10/2008 | Schneider et al. | |
| 2008/0309200 A1 | 12/2008 | Melandso et al. | |
| 2009/0204001 A1 | 8/2009 | Ona et al. | |
| 2010/0106431 A1 | 4/2010 | Baba et al. | |
| 2010/0168583 A1 | 7/2010 | Dausch et al. | |
| 2011/0215150 A1 | 9/2011 | Schneider et al. | |
| 2012/0188849 A1 | 7/2012 | Matsuda et al. | |
| 2012/0206014 A1 | 8/2012 | Bibl et al. | |
| 2012/0245408 A1 | 9/2012 | Shen et al. | |
| 2013/0134838 A1 | 5/2013 | Yun et al. | |
| 2013/0258805 A1 | 10/2013 | Hansen et al. | |
| 2013/0286778 A1 | 10/2013 | Kisner et al. | |
| 2013/0293065 A1 | 11/2013 | Hajati et al. | |
| 2014/0219521 A1 | 8/2014 | Schmitt et al. | |
| 2014/0232241 A1 | 8/2014 | Hajati | |
| 2014/0243676 A1 | 8/2014 | Cogan et al. | |
| 2014/0354608 A1 | 12/2014 | Kitchens, II et al. | |
| 2015/0020608 A1 | 1/2015 | Chevrier et al. | |
| 2015/0087991 A1 | 3/2015 | Chen et al. | |
| 2015/0165479 A1* | 6/2015 | Lasiter | B06B 1/0666 310/322 |
| 2015/0169136 A1 | 6/2015 | Ganti et al. | |
| 2015/0198699 A1 | 7/2015 | Kuo et al. | |
| 2015/0346903 A1 | 12/2015 | O'Connor | |
| 2015/0357375 A1 | 12/2015 | Tsai et al. | |
| 2016/0107194 A1* | 4/2016 | Panchawagh | G06F 3/043 367/140 |
| 2016/0131747 A1* | 5/2016 | Tang | G06F 3/043 367/140 |
| 2016/0132187 A1* | 5/2016 | Lu | G06F 3/043 345/177 |
| 2017/0110504 A1* | 4/2017 | Panchawagh | H01L 27/20 |

FOREIGN PATENT DOCUMENTS

| | | | |
|---|---|---|---|
| DE | 3940808 A1 | 6/1991 | |
| GB | 2511556 | 9/2014 | |
| JP | S538288 Y1 | 3/1978 | |
| JP | 2013135793 A | 7/2013 | |
| KR | 20180066096 A * | 6/2018 | ............ H01L 27/20 |
| WO | WO-2014108960 A1 | 7/2014 | |
| WO | WO-2015086413 A1 | 6/2015 | |
| WO | WO 2016061406 A1 | 4/2016 | |
| WO | WO 2016061410 A1 | 4/2016 | |
| WO | WO 2016061412 A1 | 4/2016 | |
| WO | WO-2017066612 A1 * | 4/2017 | ............ H01L 27/20 |
| WO | WO 2017066612 A1 | 4/2017 | |

OTHER PUBLICATIONS

International Preliminary Report on Patentability—PCT/US2015/055825—ISA/EPO—dated Feb. 3, 2017.
Second Written Opinion of the International Preliminary Examining Authority—PCT/US2015/055827—ISA/EPO—dated Sep. 26, 2016.
International Preliminary Report on Patentability—PCT/US2015/055827—ISA/EPO—dated Feb. 3, 2017.
Second Written Opinion of the International Preliminary Examining Authority—PCT/US2015/055821—ISA/EPO—dated Sep. 26, 2016.
International Preliminary Report on Patentability—PCT/US2015/055821—ISA/EPO—dated Feb. 3, 2017.
International Search Report and Written Opinion—PCT/US2016/57104—ISA/EPO—dated Jan. 23, 2017.
U.S. Corrected Notice of Allowance dated Feb. 9, 2018 issued in U.S. Appl. No. 14/883,585.
U.S. Supplemental Notice of Allowance dated Jan. 29, 2018 issued in U.S. Appl. No. 14/883,585.
U.S. Notice of Allowance dated Jan. 16, 2018 issued in U.S. Appl. No. 14/883,585.
U.S. Office Action dated Jan. 3, 2018 issued in U.S. Appl. No. 14/883,586.
U.S. Office Action dated May 3, 2017 issued in U.S. Appl. No. 14/883,586.
U.S. Office Action dated Sep. 1, 2017, issued in U.S. Appl. No. 14/883,585.
U.S. Final Office Action dated Oct. 18, 2017, issued in U.S. Appl. No. 14/883,586.
International Search Report and Written Opinion—PCT/US2015/055827—ISA/EPO—dated Feb. 4, 2016.
International Search Report and Written Opinion—PCT/US2015/055821—ISA/EPO—dated Feb. 4, 2016.
International Search Report and Written Opinion—PCT/US2015/055825—ISA/EPO—dated Feb. 8, 2016.
U.S. Notice of Allowance dated Apr. 12, 2018 issued in U.S. Appl. No. 14/883,583.
U.S. Office Action dated Jul. 2, 2018 issued in U.S. Appl. No. 14/883,586.
International Preliminary Report on Patentability dated Apr. 26, 2018 in PCT/US2016/057104.
U.S. Supplemental Notice of Allowance dated Jul. 18, 2018, issued in U.S. Appl. No. 14/883,586.
U.S. Notice of Allowance dated Jul. 2, 2018 issued in U.S. Appl. No. 14/883,586.

* cited by examiner

INTEGRATED PIEZOELECTRIC MICROMECHANICAL ULTRASONIC TRANSDUCER PIXEL AND ARRAY

CROSS-REFERENCE TO RELATED APPLICATIONS

This disclosure claims priority to U.S. Provisional Patent Application No. 62/241,651, filed on Oct. 14, 2015, entitled "INTEGRATED PIEZOELECTRIC MICROMECHANICAL ULTRASONIC TRANSDUCER PIXEL AND READOUT," which is hereby incorporated by reference.

TECHNICAL FIELD

This disclosure relates to piezoelectric ultrasonic transducers and to an electronic sensor array or interactive display of piezoelectric transducers for biometric sensing, imaging, and touch or gesture recognition.

DESCRIPTION OF THE RELATED TECHNOLOGY

Thin film piezoelectric acoustic transducers are attractive candidates for numerous applications including biometric sensors such as fingerprint sensors, gesture detection devices, microphones and speakers, ultrasonic imaging devices, and chemical sensors. Such transducers may include piezoelectric micromechanical ultrasonic transducers (PMUTs) configured as a multilayer stack that includes a piezoelectric layer stack and a mechanical layer disposed over a cavity. The piezoelectric layer stack may include a layer of piezoelectric material. In some applications, a one- or two-dimensional array of any number of PMUT elements (a "PMUT array") may be contemplated.

It is desirable to configure the PMUT array such that each PMUT element, consisting of a single diaphragm, functions as both a transmitter and a receiver of ultrasonic signals in order to improve efficiency, speed and resolution as well as to achieve integration and cost benefits. For a PMUT array configured as a fingerprint sensor, for example, some thousands of PMUT elements may be arranged in an array, wherein each PMUT element may be required to be read out at a sufficiently fast rate that a user fingerprint may be imaged and authenticated in a short time period. Conventional ultrasonic imaging arrays may need exceedingly large numbers of hard-wired interconnections to external interface circuitry that can limit the size of the array. As a result, improved PMUT drive/readout schemes are desirable.

SUMMARY

The systems, methods and devices of this disclosure each have several innovative aspects, no single one of which is solely responsible for the desirable attributes disclosed herein.

One innovative aspect of the subject matter described in this disclosure relates to an ultrasonic sensor pixel that includes a substrate, a piezoelectric micromechanical ultrasonic transducer (PMUT) and a sensor pixel circuit. The PMUT includes a piezoelectric layer stack including a piezoelectric layer disposed over a cavity, the cavity being disposed between the piezoelectric layer stack and the substrate, a reference electrode disposed between the piezoelectric layer and the cavity, and one or both of a receive electrode and a transmit electrode disposed on or proximate to a first surface of the piezoelectric layer, the first surface being opposite from the cavity. The sensor pixel circuit is electrically coupled with one or more of the reference electrode, the receive electrode and the transmit electrode, and the PMUT and the sensor pixel circuit are integrated with the sensor pixel circuit on the substrate.

In some examples, the PMUT may be configured to generate an ultrasonic wave when a transmitter excitation signal is applied to the transmit electrode.

In some examples, the sensor pixel circuit may be configured to generate a pixel output signal indicating a strength or magnitude of a reflected ultrasonic pressure wave impinging on the PMUT.

In some examples, the sensor pixel circuit may include a diode and a readout transistor and at least one of a peak detector, a peak-to-peak detector, a sample-and-hold circuit, an envelope detector, and a charge integrator. In some examples, the diode may be configured to be biased using a bias signal, such that the diode operates in a peak-detecting mode of operation or a rectification mode of operation. In some examples, the bias signal may correspond to a receiver bias voltage or a diode bias voltage, the bias signal being applied to the reference electrode, the transmit electrode a terminal of the diode. In some examples, the bias signal may include multiple levels of temporally separated bias voltages. In some examples, each of the multiple levels of the temporally separated bias voltages may correspond to a respective one of a hold value, a block value, and a sample value. In some examples, one of the multiple levels of temporally separated bias voltages may correspond to the sample value, the sample value being held for a duration corresponding to an acquisition time window to detect a reflected ultrasonic wave. In some examples, the duration may be substantially shorter than the period of one cycle of a transmitter excitation signal. In some examples, each of the multiple levels of the temporally separated bias voltages may correspond to a respective one of a hold value and a sample value.

In some examples, the substrate may include one or more of a silicon wafer, a silicon-on-insulator (SOI) wafer, a silicon or SOI wafer with integrated circuitry, a semiconductor substrate, and a glass or polymer substrate with thin film transistor (TFT) circuitry.

In some examples, the sensor pixel circuit may include thin-film transistor (TFT) circuitry or CMOS circuitry that is co-fabricated with the PMUT on the substrate.

In some examples, the PMUT may overlay or underlay the sensor pixel circuit, such that the PMUT and the sensor pixel circuit are contained within a common footprint area.

In some examples, the sensor pixel circuit may be contained within a first footprint area, the PMUT contained within a second footprint area, and the first footprint area smaller than the second footprint area.

According to some implementations, an ultrasonic sensor array includes a substrate and a plurality of ultrasonic sensor pixels, each sensor pixel including a piezoelectric micromechanical ultrasonic transducer (PMUT). Each ultrasonic sensor pixel includes a respective sensor pixel circuit, disposed on the substrate beneath the PMUT, and electrically coupled with the PMUT.

In some examples, each PMUT may include a piezoelectric layer stack including a piezoelectric layer disposed over a cavity, the cavity being disposed between the piezoelectric layer stack and the substrate, a reference electrode disposed between the piezoelectric layer and the cavity, and one or both of a receive electrode and a transmit electrode disposed on or proximate to a first surface of the piezoelectric layer, the first surface being opposite from the cavity.

In some examples, a transmitter excitation signal may be applied to a transmit electrode of a plurality of PMUTs in the ultrasonic sensor array to generate a substantially plane ultrasonic wave.

In some examples, a plurality of transmitter excitation signals may be applied to some or all of the PMUTs in the ultrasonic sensor array to generate a beamformed ultrasonic wave.

In some examples, each sensor pixel circuit may be configured to provide a pixel output signal representing a local magnitude of a reflected portion of an ultrasonic wave at a selected time after launching the ultrasonic wave from the ultrasonic sensor array.

In some examples, each respective sensor pixel circuit includes a diode bias driver terminal, a reset terminal and a read driver terminal. In some examples, the ultrasonic sensor array includes a sensor controller configured to selectively initiate a transmit mode of operation, a receive mode of operation, and a read mode of operation at the ultrasonic sensor array by signaling one or more of a receiver bias electrode, the diode bias driver terminal, the reset terminal, and the read driver terminal.

According to some implementations, a method of making an ultrasonic sensor pixel includes forming a piezoelectric micromechanical ultrasonic transducer (PMUT) over a substrate, the substrate including a sensor pixel circuit, the PMUT including a piezoelectric layer stack including a piezoelectric layer disposed over a cavity, a reference electrode disposed between the piezoelectric layer stack and the cavity, and one or both of a receive electrode and a transmit electrode disposed on or proximate to a first surface of the piezoelectric layer stack, the first surface being opposite from the cavity; and forming a conductive path between the sensor pixel circuit and at least one of the reference electrode, the receive electrode and the transmit electrode.

In some examples, the sensor pixel circuit may include a pixel input electrode, and the conductive path may electrically couple the receive electrode with the pixel input electrode.

In some examples, the sensor pixel circuit may include a diode and a readout transistor. In some examples, the diode may be configured to be biased using a bias signal, such that the diode operates in a peak-detecting mode of operation or a rectification mode of operation.

In some examples, the PMUT may overlay the sensor pixel circuit, such that the PMUT and the sensor pixel circuit are contained within a common footprint area.

In some examples, the sensor pixel circuit may be contained within a first footprint area, the PMUT is contained within a second footprint area, and the first footprint area is smaller than the second footprint area.

According to some implementations, an apparatus includes a substrate, a piezoelectric micromechanical ultrasonic transducer (PMUT) that includes a piezoelectric layer stack including a piezoelectric layer disposed over a cavity, the cavity being disposed between the piezoelectric layer stack and the substrate, a reference electrode disposed between the piezoelectric layer and the cavity, and one or both of a receive electrode and a transmit electrode disposed on or proximate to a first surface of the piezoelectric layer, the first surface being opposite from the cavity. The apparatus further includes a sensor pixel circuit electrically coupled with the PMUT; and means, electrically coupled with the PMUT and integrated with the PMUT on the substrate, for generating a pixel output signal indicating a strength or magnitude of a reflected ultrasonic wave impinging on the PMUT.

In some examples, the substrate may include one or more of a silicon wafer, a silicon-on-insulator (SOI) wafer, a silicon or SOI wafer with integrated circuitry, a semiconductor substrate, and a glass or polymer substrate with thin film transistor (TFT) circuitry.

BRIEF DESCRIPTION OF THE DRAWINGS

Details of one or more implementations of the subject matter described in this specification are set forth in this disclosure and the accompanying drawings. Other features, aspects, and advantages will become apparent from a review of the disclosure. Note that the relative dimensions of the drawings and other diagrams of this disclosure may not be drawn to scale. The sizes, thicknesses, arrangements, materials, etc., shown and described in this disclosure are made only by way of example and should not be construed as limiting. Like reference numbers and designations in the various drawings indicate like elements.

DETAILED DESCRIPTION

Figure 1A:
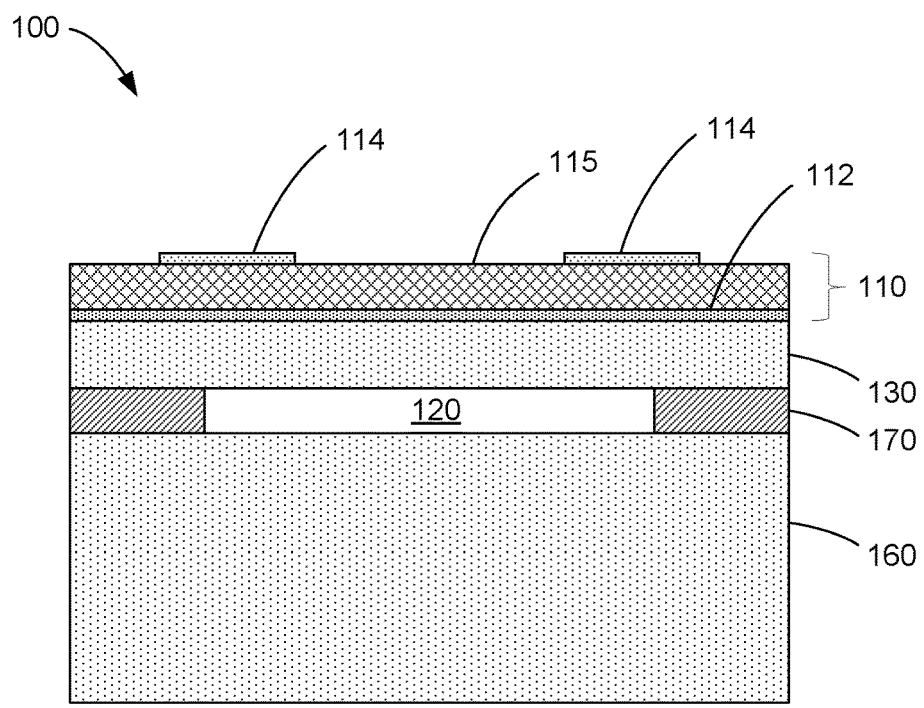
FIGS. 1A-1B illustrate an example of a piezoelectric ultrasonic transducer.

The systems, methods and devices of the disclosure each have several innovative aspects, no single one of which is solely responsible for the desirable attributes disclosed herein. One innovative aspect of the subject matter described in this disclosure may be implemented in a piezoelectric micromechanical ultrasonic transducer (PMUT) configured as a multilayer stack that includes a multilayer diaphragm structure that includes a piezoelectric layer stack and two or more electrodes. In implementations with three electrodes, the three electrodes may include a separate electrode for each of transmitting signals to and receiving signals from associated transceiver circuitry, and a common reference or ground electrode. The arrangement allows transmit and receive timings to be independent of each other, thereby enabling, for example, simultaneous transmission and reception of ultrasonic waves. In some implementations, transmit and receive electrodes may be formed in the same electrode layer. In some implementations, each of the transmit electrode and the receive electrode may experience a differing orientation of mechanical stress or strain during bending. For example, where one electrode is disposed proximate to an interior region of the diaphragm and the other electrode is disposed proximate to an outer region of the diaphragm, a first portion of the piezoelectric layer proximate to the first electrode may be under tension at the same time that a second portion of the diaphragm layer proximate to the second electrode is under compression. As a result, the arrangement avoids degradation in efficiency during times of simultaneous transmitter and receiver operation.

One innovative aspect of the subject matter described in this disclosure may be implemented in an apparatus that includes a one- or two-dimensional array of piezoelectric micromechanical ultrasonic transducer (PMUT) elements positioned below, beside, with, on or above a substrate, such as a substrate of a display or an ultrasonic fingerprint sensor array.

Aspects of piezoelectric micromechanical ultrasonic transducers have been described in U.S. patent application Ser. No. 14/569,280, filed on Dec. 12, 2014 and entitled "MICROMECHANICAL ULTRASONIC TRANSDUCERS AND DISPLAY," and in U.S. patent application Ser. No. 14/569,256, filed on Dec. 12, 2014 and entitled "PIEZOELECTRIC ULTRASONIC TRANSDUCER AND PROCESS", U.S. patent application Ser. No. 14/883,583, filed on Oct. 14, 2015 and entitled "THREE-PORT PIEZOELECTRIC ULTRASONIC TRANSDUCER", U.S. patent application Ser. No. 14/883,585, filed on Oct. 14, 2015 and entitled "ACTIVE BEAM-FORMING TECHNIQUE FOR PIEZOELECTRIC ULTRASONIC TRANSDUCER ARRAY", and U.S. patent application Ser. No. 14/883,586, filed on Oct. 14, 2015 and entitled "SUPERPIXEL ARRAY OF PIEZOELECTRIC ULTRASONIC TRANSDUCERS FOR 2-D BEAMFORMING", each owned by the assignee of the present invention and hereby incorporated by reference into the present application in its entirety for all purposes.

Referring to FIG. 1A, a piezoelectric ultrasonic transducer 100 may be configured such that it includes a piezoelectric layer stack 110 and a mechanical layer 130 disposed so as to form a diaphragm (which may be referred to hereinbelow as a "PMUT diaphragm" or "deformable diaphragm") supported by an anchor structure 170 over a cavity 120. The piezoelectric layer stack 110 includes a piezoelectric layer 115, a lower electrode 112 and an upper electrode 114. In the illustrated implementation, the lower electrode 112 is disposed below the piezoelectric layer 115 and proximate to the cavity 120, whereas the upper electrode 114 is disposed above the piezoelectric layer 115, proximate to a surface of the piezoelectric layer 115 that is opposite to the cavity 120. The cavity 120 may be formed in or on a substrate 160. The substrate 160 may be or include, for example, a silicon wafer, a silicon-on-insulator (SOI) wafer, a silicon or SOI wafer with integrated circuitry, a semiconductor substrate, or a glass or polymer substrate with thin film transistor (TFT) circuitry. In some implementations, the substrate may be a flexible substrate such as a thin layer of polyimide (PI), polyethylene naphthalate (PEN) or polyethylene terephthalate (PET), or a flexible substrate with InGaZnO (IGZO) circuitry.

Figure 1B:
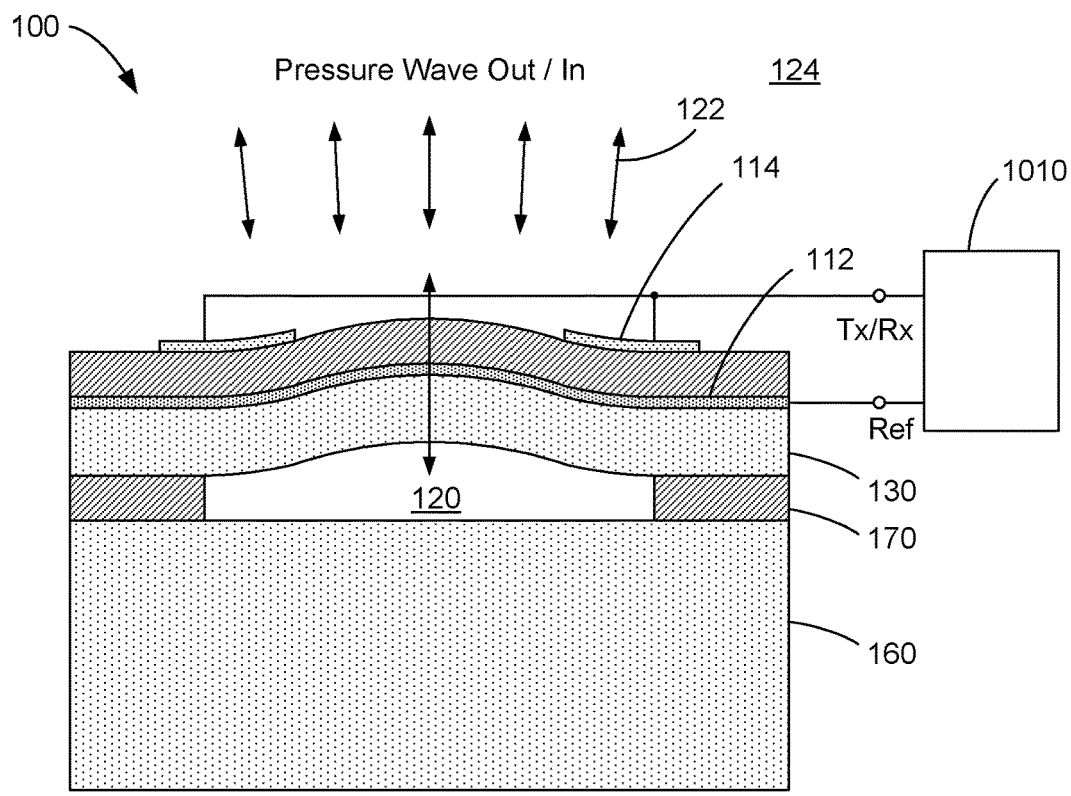

Referring now to FIG. 1B, during operation, the piezoelectric layer stack 110 and the mechanical layer 130 may be caused to bend and vibrate in response to a time-varying excitation voltage applied across the upper electrode 114 and the lower electrode 112 by transceiver circuitry 1010. As a result, one or more ultrasonic pressure waves 122 having frequencies in, for example, an ultrasonic frequency band, may be propagated into a propagation medium 124. In some implementations, the propagation medium 124 may include air, a platen, a cover glass, a device enclosure, or an acoustic coupling or matching layer. The piezoelectric layer stack 110 may likewise receive reflected ultrasonic pressure waves from an object in the propagation medium, and convert the received ultrasonic pressure waves into electrical signals that may be read by the transceiver circuitry 1010. The deformable diaphragm over the cavity 120 may bend and vibrate in response to the reflected ultrasonic pressure wave impinging on a surface of the PMUT, generating mechanical stresses and strains in the PMUT diaphragm and surface charge on the surfaces of the piezoelectric layer that may be detected by underlying circuitry. In some implementations, the lower electrode 112 (sometimes referred to herein as a reference electrode) may be grounded, connected to a constant bias voltage (e.g., a reference voltage), or connected to a multi-level bias signal such as a receiver bias voltage that may be provided by the transceiver circuitry 1010.

In some implementations, the PMUT array may be configured to operate in modes corresponding to multiple frequency ranges. In some implementations, for example, the PMUT array may be configurable to operate in a low-frequency mode corresponding to a low-frequency range (e.g., 50 kHz to 200 kHz) or in a high-frequency mode corresponding to a high-frequency range (e.g., 1 MHz to 25 MHz). When operating in the high-frequency mode, the PMUT array may be capable of imaging at relatively higher resolution. Accordingly, the PMUT array may be capable of detecting touch, fingerprint, stylus, and biometric information from an object such as a finger placed on the surface of the display or sensor array. Such a high-frequency mode may be referred to herein as a fingerprint sensor mode.

When operating in the low-frequency mode, the PMUT array may be capable of emitting sound waves that are capable of relatively greater penetration into air than when the apparatus is operating in the high-frequency mode. Such lower-frequency sound waves may be transmitted through various overlying layers including a cover glass, a touchscreen, a display array, a backlight, a housing or enclosure, or other layers positioned between an ultrasonic transmitter and a display or sensor surface. In some implementations, a port may be opened through one or more of the overlying layers to optimize acoustic coupling from the PMUT array into air. The lower-frequency sound waves may be transmitted through the air above the display or sensor surface, reflected from one or more objects near the surface, transmitted through the air and back through the overlying layers, and detected by an ultrasonic receiver. Accordingly, when operating in the low-frequency mode, the PMUT array may be capable of operating in a gesture detection mode, wherein free-space gestures near but not necessarily touching the display may be detected.

Alternatively, or additionally, in some implementations, the PMUT array may be configurable to operate in a medium-frequency mode corresponding to a frequency range between the low-frequency range and the high-frequency range (e.g., about 200 kHz to about 1 MHz). When operating in the medium-frequency mode, the PMUT array may be capable of providing touch sensor functionality, although with somewhat less resolution than the high-frequency mode.

The PMUT array may be addressable for wavefront beam forming, beam steering, receive-side beam forming, and/or selective readout of returned signals. For example, individual columns, rows, sensor pixels and/or groups of sensor pixels may be separately addressable. A control system may control an array of transmitters to produce wavefronts of a particular shape, such as planar, circular or cylindrical wavefronts. The control system may control the magnitude and/or phase of the array of transmitters to produce constructive or destructive interference in desired locations. For example, the control system may control the magnitude and/or phase of the array of transmitters to produce constructive interference in one or more locations in which a touch or gesture has been detected or is likely to be detected.

In some implementations, PMUT devices may be co-fabricated with thin-film transistor (TFT) circuitry or CMOS circuitry on or in the same substrate, which may be a silicon, SOI, glass or plastic substrate, in some examples. The TFT substrate may include row and column addressing electronics, multiplexers, local amplification stages and control circuitry. In some implementations, an interface circuit including a driver stage and a sense stage may be used to excite a PMUT device and detect responses from the same device. In other implementations, a first PMUT device may serve as an acoustic or ultrasonic transmitter and a second PMUT device may serve as an acoustic or ultrasonic receiver. In some configurations, different PMUT devices may be capable of low- and high-frequency operation (e.g., for gestures and for fingerprint detection). In other configurations, the same PMUT device may be used for low- and high-frequency operation. In some implementations, the PMUT may be fabricated using a silicon wafer with active silicon circuits fabricated in the silicon wafer. The active silicon circuits may include electronics for the functioning of the PMUT or PMUT array.

Figure 2A:
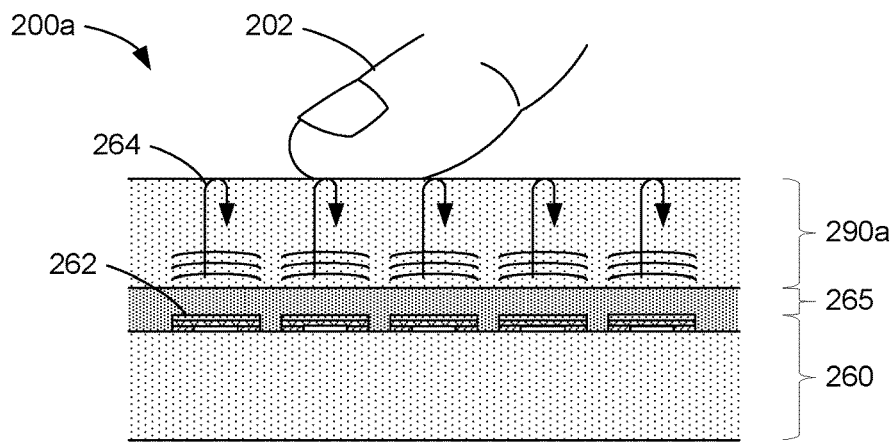
FIGS. 2A-2C illustrate cross-sectional views of various configurations of PMUT ultrasonic sensor arrays.
Figure 2B:
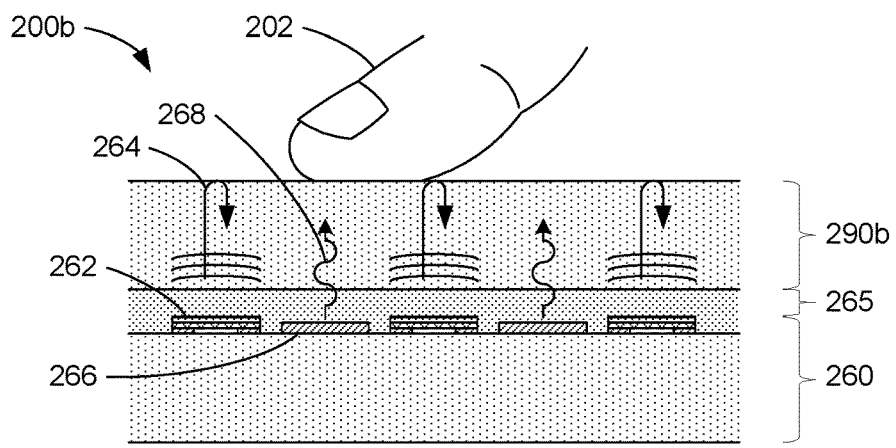
Figure 2C:
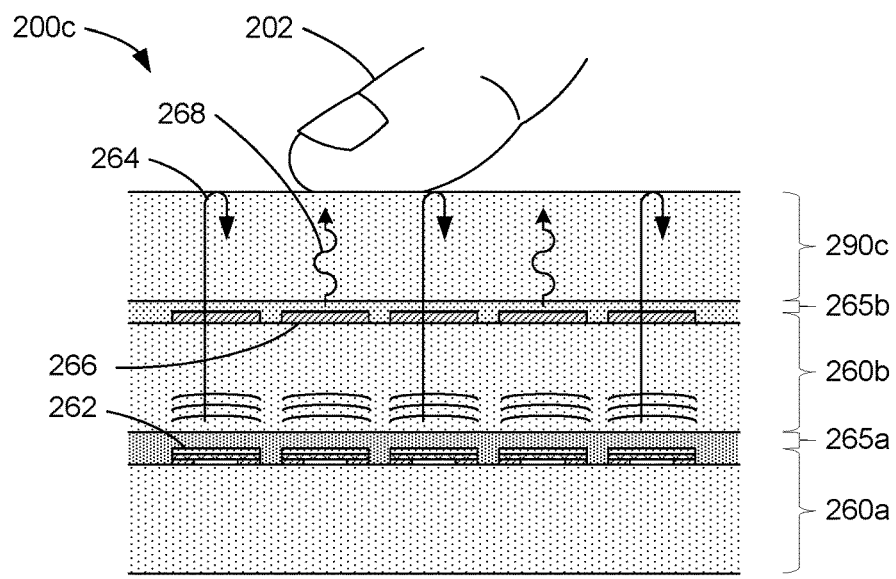

In some implementations, the PMUT array may be configured as an ultrasonic sensor array. FIGS. 2A-2C illustrate cross-sectional views of various configurations of PMUT ultrasonic sensor arrays. FIG. 2A depicts an ultrasonic sensor array 200a with PMUTs as transmitting and receiving elements that may be used, for example, as an ultrasonic fingerprint sensor, an ultrasonic touchpad, or an ultrasonic imager. PMUT sensor elements 262 on a PMUT sensor array substrate 260 may emit and detect ultrasonic waves. As illustrated, an ultrasonic wave 264 may be transmitted from at least one PMUT sensor element 262. The ultrasonic wave 264 may travel through a propagation medium such as an acoustic coupling medium 265 and a platen 290a towards an object 202 such as a finger or a stylus positioned on an outer surface of the platen 290a. A portion of the ultrasonic wave 264 may be transmitted through the platen 290a and into the object 202, while a second portion is reflected from the surface of platen 290a back towards the sensor element 262. The amplitude of the reflected wave may depend in part on the acoustic properties of the object 202. The reflected wave may be detected by the sensor elements 262, from which an image of the object 202 may be acquired. For example, with sensor arrays having a pitch of about 50 microns (about 500 pixels per inch), ridges and valleys of a fingerprint may be detected. An acoustic coupling medium 265 such as an adhesive, gel, a compliant layer or other acoustic coupling material may be provided to improve coupling between an array of PMUT sensor elements 262 disposed on the sensor array substrate 260 and the platen 290a. The acoustic coupling medium 265 may aid in the transmission of ultrasonic waves to and from the sensor elements 262. The platen 290a may include, for example, a layer of glass, plastic, sapphire, metal, metal alloy, or other platen material. An acoustic impedance matching layer (not shown) may be disposed on an outer surface of the platen 290a. The platen 290a may include a coating (not shown) on the outer surface.

FIG. 2B depicts an ultrasonic sensor and display array 200b with PMUT sensor elements 262 and display pixels 266 co-fabricated on a sensor and display substrate 260. The sensor elements 262 and display pixels 266 may be collocated in each cell of an array of cells. In some implementations, the sensor element 262 and the display pixel 266 may be fabricated side-by-side within the same cell. In some implementations, part or all of the sensor element 262 may be fabricated above or below the display pixel 266. Platen 290b may be positioned over the sensor elements 262 and the display pixels 266 and may function as or include a cover lens or cover glass. The cover glass may include one or more layers of materials such as glass, plastic or sapphire, and may include provisions for a capacitive touchscreen. An acoustic impedance matching layer or coating (not shown) may be disposed on an outer surface of the platen 290b. Ultrasonic waves 264 may be transmitted and received from one or more sensor elements 262 to provide imaging capability for an object 202 such as a stylus or a finger placed on the platen 290b. The platen 290b is substantially transparent to allow optical light from the array of display pixels 266 to be viewed by a user through the platen 290b. The user may choose to touch a portion of the platen 290b, and that touch may be detected by the ultrasonic sensor array. Biometric information such as fingerprint information may be acquired, for example, when a user touches the surface of the platen 290b. An acoustic coupling medium 265 such as an adhesive, gel, or other acoustic coupling material may be provided to improve acoustic, optical and mechanical coupling between the sensor array substrate 260 and the cover glass. In some implementations, the coupling medium 265 may be a liquid crystal material that may serve as part of a liquid crystal display (LCD). In LCD implementations, a backlight (not shown) may be optically coupled to the sensor and display substrate 260. In some implementations, the display pixels 266 may be part of an active-matrix organic light-emitting diode (AMOLED) or OLED display with light-emitting display pixels. In some implementations, the ultrasonic sensor and display array 200b may be used for display purposes and for touch, stylus or fingerprint detection.

FIG. 2C depicts an ultrasonic sensor and display array 200c with a sensor array substrate 260a positioned behind a display array substrate 260b. An acoustic coupling medium 265a may be used to acoustically couple the sensor array substrate 260a to the display array substrate 260b. An optical and acoustic coupling medium 265b may be used to optically and acoustically couple the sensor array substrate 260a and the display array substrate 260b to a cover lens or cover glass 290c, which may also serve as a platen for the detection of fingerprints. An acoustic impedance matching layer or other coating (not shown) may be disposed on an outer surface of the cover glass 290c. Ultrasonic waves 264 transmitted from one or more sensor elements 262 may travel through the display array substrate 260b and cover glass 290c, reflect from an outer surface of the cover glass 290c, and travel back towards the sensor array substrate 260a where the reflected ultrasonic waves may be detected and image information acquired. In some implementations, the ultrasonic sensor and display array 200c may be used for providing visual information to a user and for touch, stylus or fingerprint detection from the user. Alternatively, a PMUT sensor array may be formed on the backside of the display array substrate 260b. Alternatively, the sensor array substrate 260a with a PMUT sensor array may be attached to the backside of the display array substrate 260b, with the backside of the sensor array substrate 260a attached directly to the backside of the display array substrate 260b, for example, with an adhesive layer or adhesive material (not shown).

Figure 3:
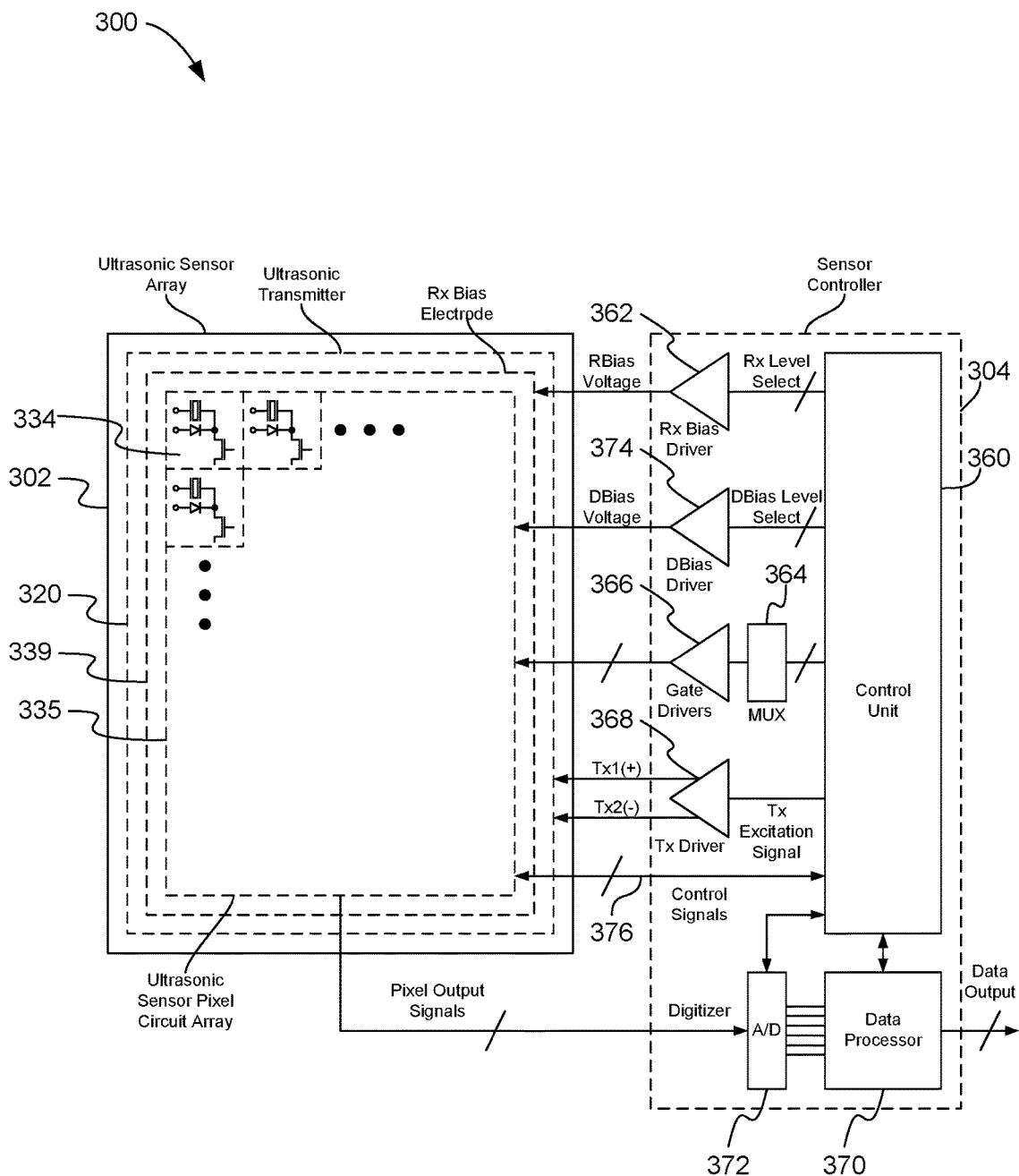
FIG. 3 illustrates a block diagram of an ultrasonic sensor system, according to an implementation.

FIG. 3 illustrates a block diagram of an ultrasonic sensor system, according to an implementation. The ultrasonic sensor system 300 may include an ultrasonic sensor array 302 that includes an ultrasonic transmitter 320, an ultrasonic sensor pixel circuit array 335 and an Rx bias electrode 339. The ultrasonic transmitter 320 may be electrically coupled with a transmitter driver ("Tx driver") 368. In some implementations, the Tx driver 368 may have a positive polarity output signal (Tx1(+)) and a negative polarity output signal (Tx2(-)) electrically coupled with one or more transmitter electrodes associated with the ultrasonic transmitter 320. The Tx driver 368 may be electrically coupled with a control unit 360 of a sensor controller 304. The control unit 360 may be configured to control various aspects of the sensor system 300, e.g., ultrasonic transmitter timing and excitation waveforms, bias voltages, pixel addressing, signal filtering and conversion, readout frame rates, and so forth. The control unit 360 may provide one or more transmitter excitation signals to the Tx driver 368. The control unit 360 may be electrically coupled with a receiver (Rx) bias driver 362 through, for example, a Rx level select input bus. The Rx bias driver 362 may provide an RBias voltage to the Rx bias electrode 339. The control unit 360 may be electrically coupled with one or more demultiplexers 364. The demultiplexers 364 may be electrically coupled with a plurality of gate drivers 366. The gate drivers 366 may be electrically coupled with the sensor pixel circuit array 335 of the ultrasonic sensor array 302. The gate drivers 366 may be positioned external to the sensor pixel circuit array 335, in some implementations. In other implementations, the gate drivers 366 may be included on a common substrate with the sensor pixel circuit array 335. The demultiplexers 364, which may be external to or included on a common substrate with the sensor pixel circuit array 335, may be used to select specific gate drivers 366. The gate drivers 366 may select one or more rows or columns of the sensor pixel circuit array 335. The sensor pixel circuit array 335, which, in the illustrated implementation, includes a number of individual ultrasonic sensor pixels 334, may be electrically coupled with one or more digitizers 372. The digitizers 372 may convert analog pixel output signals from one or more of the individual sensor pixels 334 to digital signals suitable for further processing within a data processor 370. The data processor 370 may be included (as illustrated) in the sensor controller 304. In other implementations, the data processor 370 may be external to the sensor controller 304. In the illustrated implementation, the sensor controller 304 may include one or more data processors 370 that receive data from the sensor pixel circuit array 335. The sensor controller 304 may provide data outputs to an external system or processor, such as an applications processor of a mobile device. The data processor 370 may translate the digitized data into image data of a fingerprint or format the data for further processing.

Each ultrasonic sensor pixel 334 may include a PMUT element that may serve as an ultrasonic receiver and/or an ultrasonic transmitter. Each sensor pixel 334 may also include a sensor pixel circuit that is associated with the PMUT element. The associated PMUT element may overlay each sensor pixel circuit, that is, the associated PMUT element and the sensor pixel circuit may be included within a common footprint area. Advantageously, the sensor pixel circuit may be contained in a footprint area that is no larger than a footprint area of the PMUT element. In some implementations, the ultrasonic transmitter 320 may include a layer of piezoelectric material sandwiched between two transmitter electrodes and positioned above or below the ultrasonic sensor pixel circuit array 335.

The ultrasonic transmitter 320 may be electrically coupled to and driven by the transmitter excitation signals by way of the Tx driver 368 to generate and launch ultrasonic waves. In some implementations, the transmitter excitation signals may be coupled to one or more electrodes in each PMUT or PMUT array, such as a transmit electrode associated with each PMUT, to allow the generation and launching of ultrasonic waves. In some implementations, the PMUTs in the PMUT array may be provided with a transmitter excitation signal that may be applied in common to some or all of the transmit electrodes in the PMUT array to launch a substantially plane ultrasonic wave. In some implementations, the transmitter excitation signals may be provided selectively and in a tailored time sequence to the transmit electrodes in the PMUT array so as to allow transmit-side beamforming with the PMUT elements in the PMUT array. In some implementations, the transmitter excitation signals may be provided by the transceiver circuitry 1010, which may be generated external to the PMUT ultrasonic sensor array (such as in an accompanying sensor controller 304), on the same substrate as the ultrasonic sensor array, or in each sensor pixel of the PMUT array. For example, a transmitter excitation signal may be applied to a transmit electrode of a plurality of PMUTs in the ultrasonic sensor array to generate a substantially plane ultrasonic wave. In another example, a plurality of transmitter excitation signals generated externally or within each sensor pixel circuit may be applied to some or all of the PMUTs in the ultrasonic sensor array to generate a beamformed ultrasonic wave.

In some implementations, the control unit 360 may be configured to send a Tx excitation signal to a Tx driver 368 at regular intervals so as to cause the Tx driver 368 to excite the ultrasonic transmitter 320 and produce one or more ultrasonic waves. The control unit 360 may also be configured to send level select input signals through the Rx bias driver 362 to bias the Rx bias electrode 339 and allow gating for ultrasonic signal detection by the ultrasonic sensor pixels 334. In some implementations, the control unit 360 may send level select input signals through a diode bias (DBias) driver 374 to the ultrasonic sensor pixel circuit array 335. One or more of the demultiplexers 364 may be used to turn on and off the gate drivers 366 that cause a particular row or column of the sensor pixel circuit array 335 to provide pixel output signals. Output signals from the sensor pixel circuit array 335 may be sent through a charge amplifier, a filter such as a resistor-capacitor (RC) filter or an anti-aliasing filter, and the digitizer 372 to the data processor 370. One or more control lines 376 may carry control signals between the sensor controller 304 and the ultrasonic sensor array 302.

Figure 4:
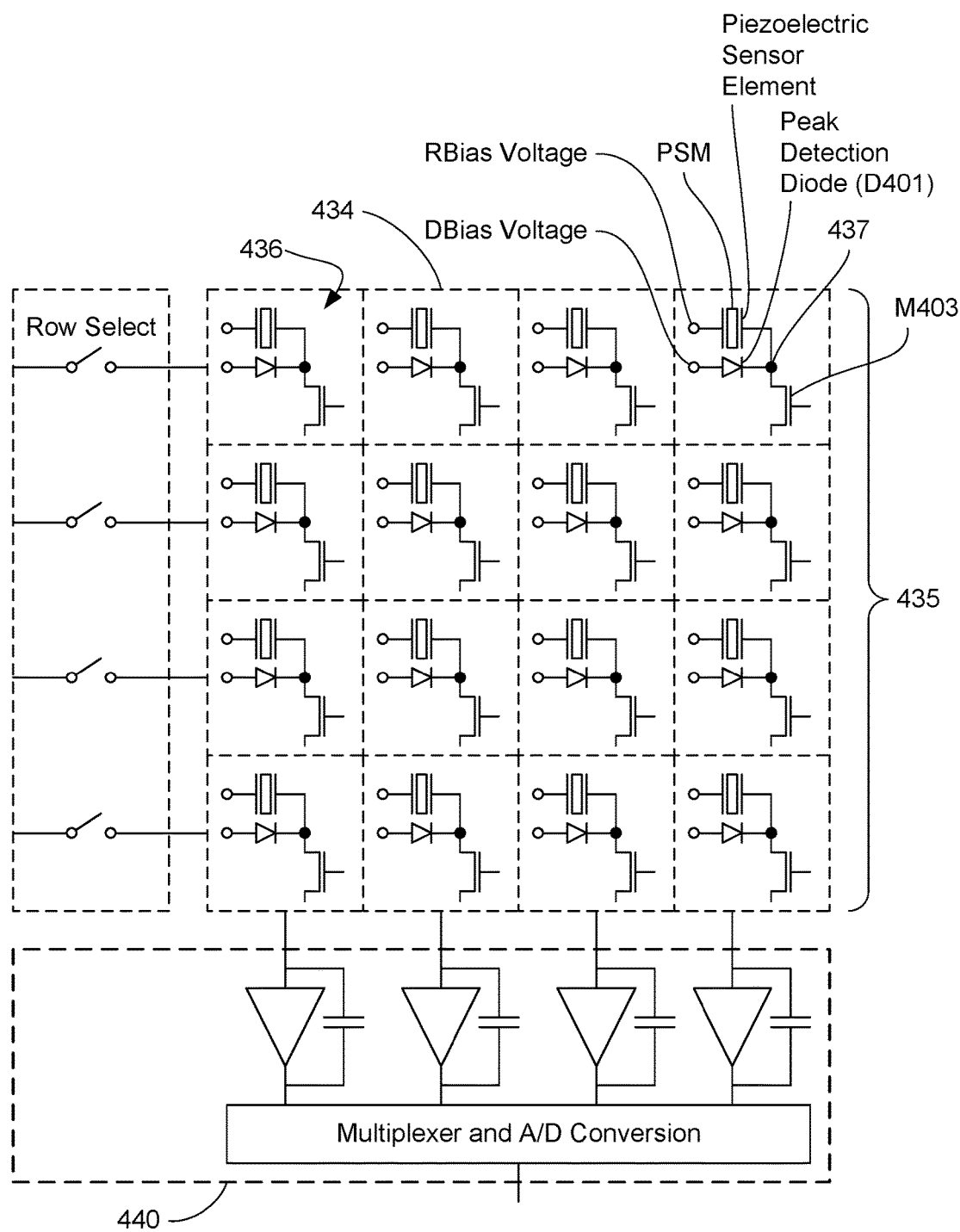
FIG. 4 illustrates a simplified block diagram of a sensor pixel array coupled with pixel readout electronics.

FIG. 4 illustrates a simplified block diagram of a sensor pixel array coupled with pixel readout electronics. In the illustrated implementation, an ultrasonic sensor pixel array 435 includes sixteen ultrasonic sensor pixels 434 arranged in a 4×4 array for an ultrasonic sensor. Each sensor pixel 434 may be associated with a local region of piezoelectric sensor material (PSM) and may include a sensor pixel circuit 436 that includes a peak detection diode D401 and a readout transistor M403. Many or all of these elements may be formed on or in a common substrate to form each sensor pixel circuit 436. In operation, the local region of PSM of each sensor pixel 434 may transduce received ultrasonic energy into electrical charges. For example, the piezoelectric layer 115 of a PMUT 100 as shown in FIG. 1 may be regarded as a PSM. The peak detection diode D401 may register the maximum amount of charge (the "peak charge") detected by the local region of PSM. Each row of the pixel circuit array 435 may then be scanned, e.g., through a row select mechanism, a gate driver, or a shift register. Each readout transistor M403 may be triggered to allow the magnitude of the peak charge for each sensor pixel 434 to be read by additional circuitry, e.g., a multiplexer and an A/D converter of pixel readout electronics 440. The sensor pixel circuit 436 may include one or more TFTs (not illustrated) to allow gating, addressing, and resetting of the sensor pixel 434. Each sensor pixel 434 may include a PMUT element that may serve as an ultrasonic receiver and/or an ultrasonic transmitter. Each PMUT element in a PMUT sensor array may be associated with a respective sensor pixel circuit 436 in the sensor pixel circuit array 435. Pixel input electrode 437 of the sensor pixel circuit 436 may be used to make electrical connection with one or more electrodes in an overlying PMUT element.

Each sensor pixel circuit 436 may provide information about a small portion of the object detected by the ultrasonic sensor system 300. While, for convenience of illustration, the example shown in FIG. 4 is of a simple 4×4 array, ultrasonic sensors having a resolution on the order of 500 pixels per inch or higher may be configured with an appropriately scaled structure. The detection area of the ultrasonic sensor system 300 may be selected depending on the intended object of detection. For example, the detection area may range from about 5 mm×5 mm for a single finger to about 80 mm×80 mm for four fingers. Smaller and larger areas, including square, rectangular and non-rectangular geometries, may be used as appropriate, depending on characteristics of the object to be detected.

Figure 5:
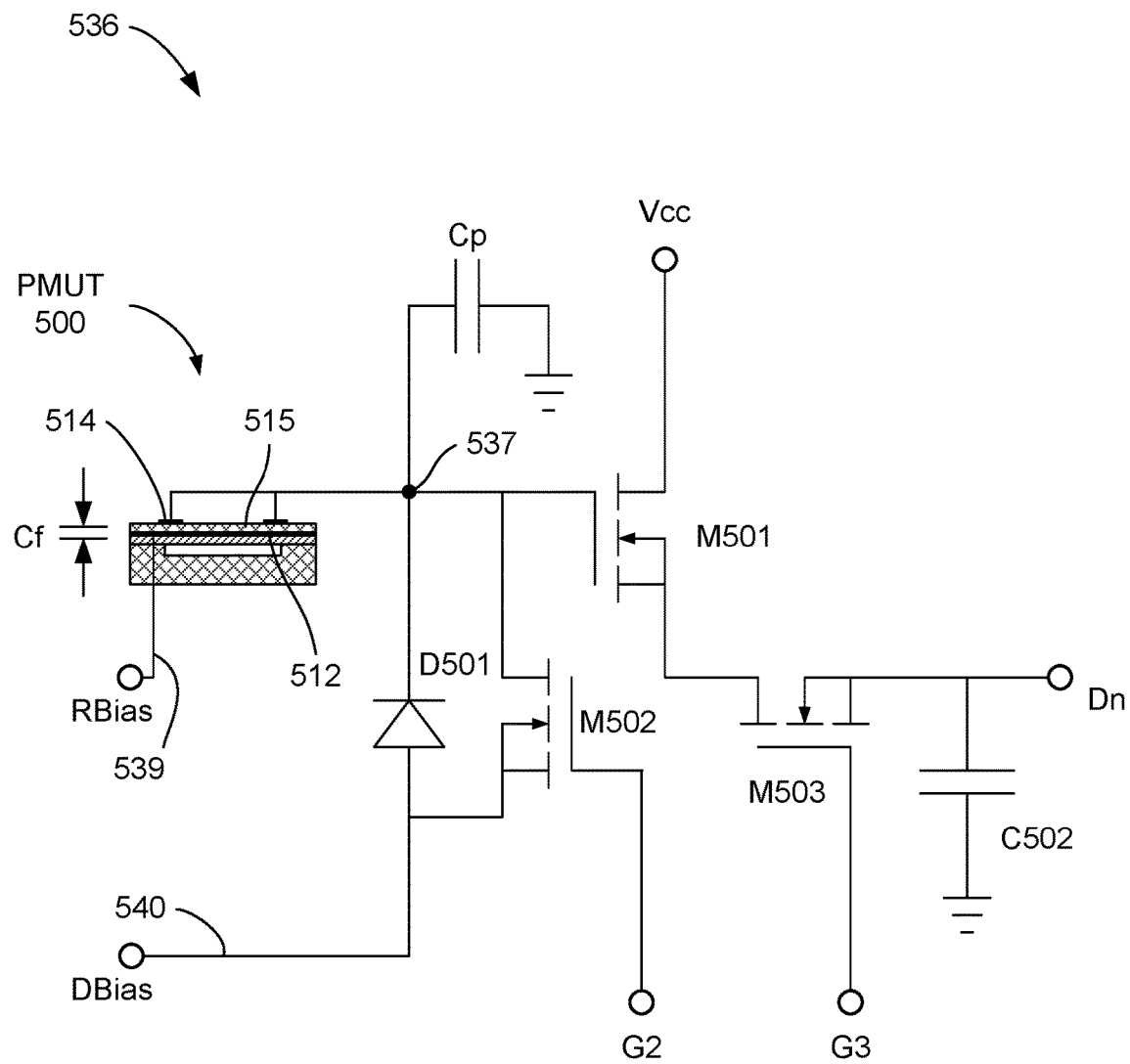
FIG. 5 illustrates an example of a sensor pixel circuit, according to an implementation.

FIG. 5 illustrates an example of a sensor pixel circuit according to an implementation. In the illustrated implementation, a sensor pixel circuit 536 is depicted that may be disposed in an array of similar pixel circuits to form a pixel array such as, for example, the ultrasonic pixel circuit array 335 illustrated in FIG. 3 or the ultrasonic pixel circuit array 435 illustrated in FIG. 4. In some implementations, each ultrasonic sensor pixel 434 in the sensor pixel array 435 may include an associated sensor pixel circuit 536. Because the sensor pixel circuit 536 may be electrically coupled with piezoelectric layers (e.g., the PSM of FIG. 4, or PMUT 500 of FIG. 5), the sensor pixel circuit 536 may detect local magnitudes of transmitted or reflected ultrasonic waves that pass through the piezoelectric layer or impinge on a surface of the PMUT, as described in more detail below.

In the example implementation of FIG. 5, the sensor pixel circuit 536 may include a PMUT 500, a capacitor Cp (the "parasitic capacitance Cp"), a diode D501, a transistor M501, a transistor M502, a transistor M503, and a capacitor C502. Each of the transistors M501, M502 and M503 may correspond to an n-type metal-oxide-semiconductor (NMOS) transistor, for example. The diode D501 may correspond to a p-n type diode or a p-i-n type (PIN) diode, and may serve as a peak-detecting or rectifying diode. As indicated in FIG. 5, the PMUT 500 may have a capacitance Cf as a result of the capacitance of the piezoelectric film or piezoelectric layer of the PMUT 500. For example, Cf may denote the capacitance between the receiver bias electrode 539 (electrically coupled with a lower electrode 512 of PMUT 500) and the pixel input electrode 537 (electrically coupled with an upper electrode 514 of PMUT 500), where a piezoelectric layer 515 that may be considered as a dielectric layer is disposed between the lower electrode 512 and the upper electrode 514. The capacitor C502 represents an output capacitance (e.g., a column or a row capacitance, depending on a particular implementation), having a capacitance that may vary with the size and configuration of the sensor array. For example, a relatively large 80 mm by 80 mm sensor array may have appreciably higher output capacitance C502 than a small rectangular 8 mm×3 mm sensor array due to longer electrical traces and a larger number of output transistors attached to the rows or columns. While square configurations may have substantially similar output capacitances whether row-addressed or column-addressed, rectangular configurations may have different output capacitances depending on whether the sensor array is row- or column-addressed.

In the example of FIG. 5, the capacitors Cf and C502 may have capacitances of approximately 13 femtofarads (fF) and 10 picofarads (pF), respectively. It should be appreciated that the example of FIG. 5 is illustrative and that device parameters (such as capacitance values) may be selected or determined based on the particular application or layout of the pixel circuits.

In the illustrated implementation, NMOS transistors are contemplated, but it will be appreciated that in alternative implementations one or more of the transistors M501, M502 and M503 may correspond to a p-type metal-oxide-semiconductor (PMOS) transistor, with adjustments to supply voltages and voltage values as needed for operation.

The transistor M501 may be responsive to a supply voltage (Vcc) for the sensor array. The supply voltage (Vcc) may also be referred to as the "array power" (AP). The transistor M501 may serve as a source follower, allowing a signal on the gate of M501 to be transferred to transistor M503 (the "pass transistor M503") and to the output Dn when the pass transistor M503 is turned on. The diode D501 and the transistor M501 (the "source follower transistor M501") may be responsive to a diode bias voltage (Diode Bias or "DBias"). The DBias voltage level may be applied to the gate of source follower transistor M501 when the diode D501 is forward biased or when the transistor M502 (the "reset transistor M502") is turned on. In the illustrated implementation, the reset transistor M502 and the pass transistor M503 are each coupled with respective gate driver G2 and G3.

The diode D501 may be biased using a bias signal, such as the DBias signal illustrated in FIG. 5, which may bias the diode D501 into a peak-detecting mode of operation or a rectification mode of operation, as illustrative examples. The diode bias signal may be applied to a diode bias electrode 540, such as a diode terminal (e.g., the anode) of diode D501. In some implementations, the diode bias signal may be generated by the transceiver circuitry 1010 of FIG. 1 or the sensor controller 304 of FIG. 3. In other implementations, the diode bias signal may be generated at another location, such as at the ultrasonic sensor array 302 of FIG. 3.

In operation, the sensor pixel circuit 536 may be responsive to an ultrasonic pressure wave passing through or impinging on a surface of the PMUT, such as a reflected portion of ultrasonic wave 264 shown in FIG. 2. The ultrasonic wave may be reflected from a target object 202 (e.g., a finger of a user, as illustrated in FIG. 2, or a stylus) placed on an outer surface of the sensor array. The reflection may generate a charge/voltage in accordance with a piezoelectric effect. For example, the reflection may cause dynamic tensile and compressive mechanical stresses to crystalline structures and/or ceramic structures in the piezoelectric layer 515 of the PMUT 500. The mechanical stress may generate a surface charge or voltage that can be detected by the sensor pixel circuit 536, such as by the diode D501. More particularly, a rectified signal and an initial bias voltage on the gate of the source follower transistor M501 may determine the gate voltage of the source follower transistor M501, which may be read out by turning on the pass transistor M503 of the sensor pixel circuit 536. In the example of FIG. 5, the parasitic capacitance Cp may shunt certain alternating current (AC) signals to ground, thus filtering certain signals (e.g., high frequency noise). The sensor pixel circuit 536 may generate a pixel output signal or data output signal (Dn) having a magnitude or voltage indicating a strength or magnitude of the reflected ultrasonic wave as detected by the sensor pixel circuit 536. The data output signal (Dn) may correspond to one of the pixel output signals of FIG. 3.

In some implementations, the receiver bias electrode 539 (e.g., lower electrode 512 of PMUT 500) may be capacitively coupled to the gate of transistor M501. A capacitive voltage divider may be formed between Cf and the gate capacitance of transistor M501. Operation of the capacitive voltage divider may be further affected by the parasitic capacitances Cp and the capacitances associated with the reset transistor M502 and the diode D501. When a receiver bias voltage is applied to the receiver bias electrode 539, an M501 gate bias voltage may be generated at the gate of the transistor M501 in accordance with a capacitive voltage divider network. For example, the M501 gate bias voltage may serve to bias transistor M501 in an "on" state.

In some implementations, a multi-level mode of operation may be contemplated. For example, in a first mode of operation a "block" value or voltage applied to the receiver bias electrode 539 may bias the diode D501 to operate in a deep reverse bias mode that may cause voltages generated by the piezoelectric layer due to an ultrasonic wave to be blocked. In a second mode of operation, a "sample" value or voltage applied to the receiver bias electrode 539 may bias and allow the voltage on the cathode of diode D501 to operate in a forward bias mode and rectify signal voltages generated across the piezoelectric layer. In a third mode of operation, a "hold" value or voltage applied to the receiver bias electrode 539 may bias the diode D501 to operate in a mild reverse bias mode and allow the sample voltage value on the gate of transistor M501 of sensor pixel circuit 536 to be read out when desired.

In some implementations, multiple levels of bias voltages may be applied to the diode bias electrode 540 of FIG. 5. These diode bias values may correspond to a hold value, a block value, and a sample value to allow operation in a ready or hold mode, a block mode, a sample mode, respectively. In an illustrative implementation, the sensor controller 304 may be configured to selectively initiate a hold mode of operation, a block mode of operation, or a sample mode of operation at the ultrasonic sensor array 302 by selectively biasing the diode bias electrode 540 of the sensor pixel circuit 536. For example, a bias voltage may have a hold value applied to the diode bias electrode 540 to cause the sensor pixel circuit 536 to maintain a current value (e.g., to "hold" a current value). The bias voltage may have a block value applied to the diode bias electrode 540 to inhibit the sensor pixel circuit 536 from acquiring or detecting signals (e.g., to "block" the sensor pixel circuit 536 from acquiring or detecting signals). The bias voltage may have a sample value applied to the diode bias electrode 540 to cause the sensor pixel circuit 536 to detect ultrasonic waves (e.g., to "sample" the ultrasonic waves). During these operational modes with DBias level control, the value applied to the receiver bias electrode 539 may be held constant (such as at a ground or reference potential) or caused to vary in some implementations. The values and timing of applying DBias levels may vary from those for RBias level control, yet the functionality may be similar or substantially similar. In other implementations, functionality of DBias may be different than functionality of RBias. Other operational modes may vary either RBias values, DBias values, or both during operation.

Thus, a TFT pixel circuit (e.g., the sensor pixel circuit 536) may include a diode (e.g., the diode D501) that is responsive to a DBias signal. The sensor pixel circuit 536 may further include a first transistor, such as the transistor M501. The first transistor may be responsive to a receiver bias voltage (RBias) via capacitive coupling. For example, a gate terminal of the first transistor may be capacitively coupled to the receiver bias electrode 539. The PMUT may be configured to generate a surface charge based on a reflected ultrasonic wave as described above. The diode D501 and the first transistor M501 may be responsive to the surface charge to generate a particular signal. The sensor pixel circuit 536 may further include a second transistor, such as the transistor M503. The second transistor M503 may be responsive to the particular signal to generate a data output signal Dn of the sensor pixel circuit 536, such as the data output signal (Dn) of FIG. 5. The data output signal Dn may be included in the data output of FIG. 3.

Figure 6A:
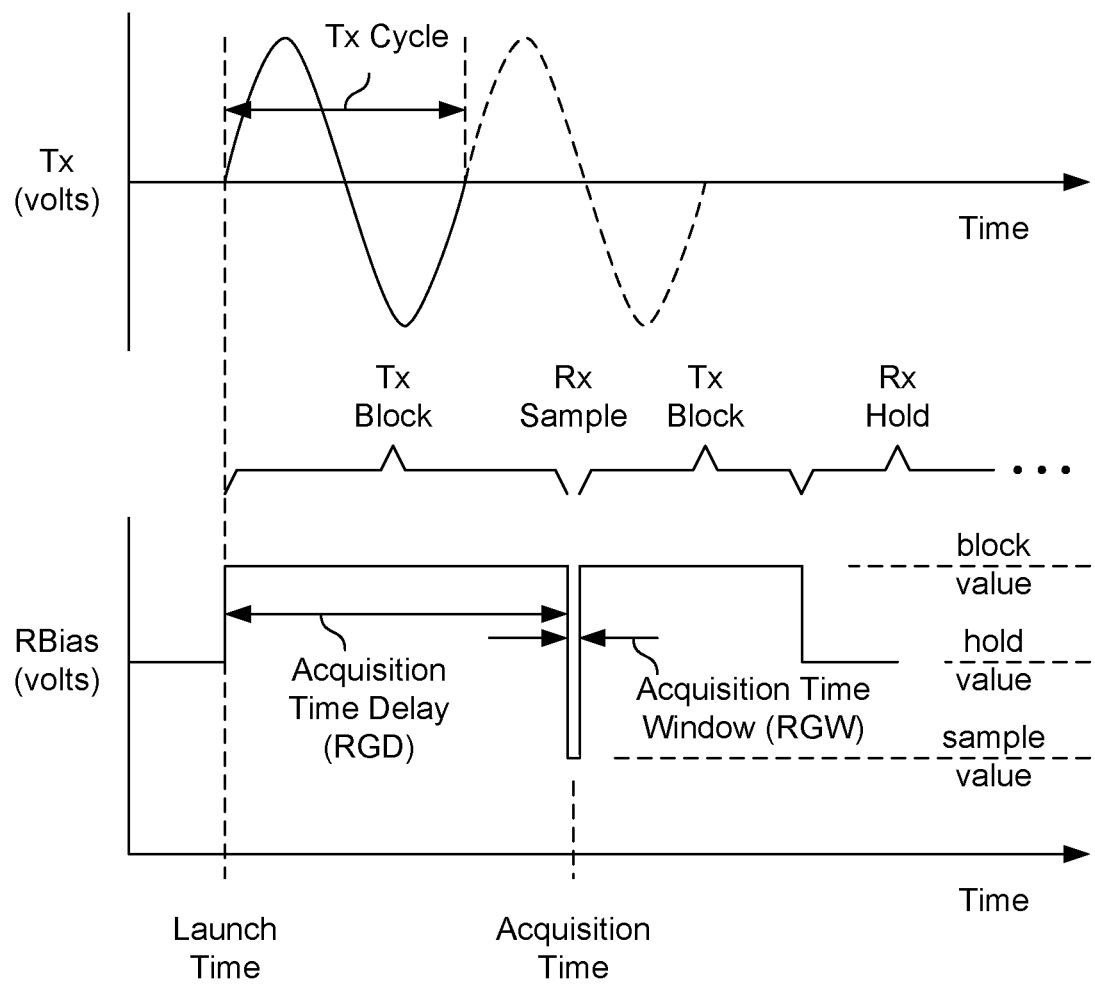
FIGS. 6A-6B graphically illustrate examples of transmitter excitation signals and receiver bias levels as a function of time.
Figure 6B:
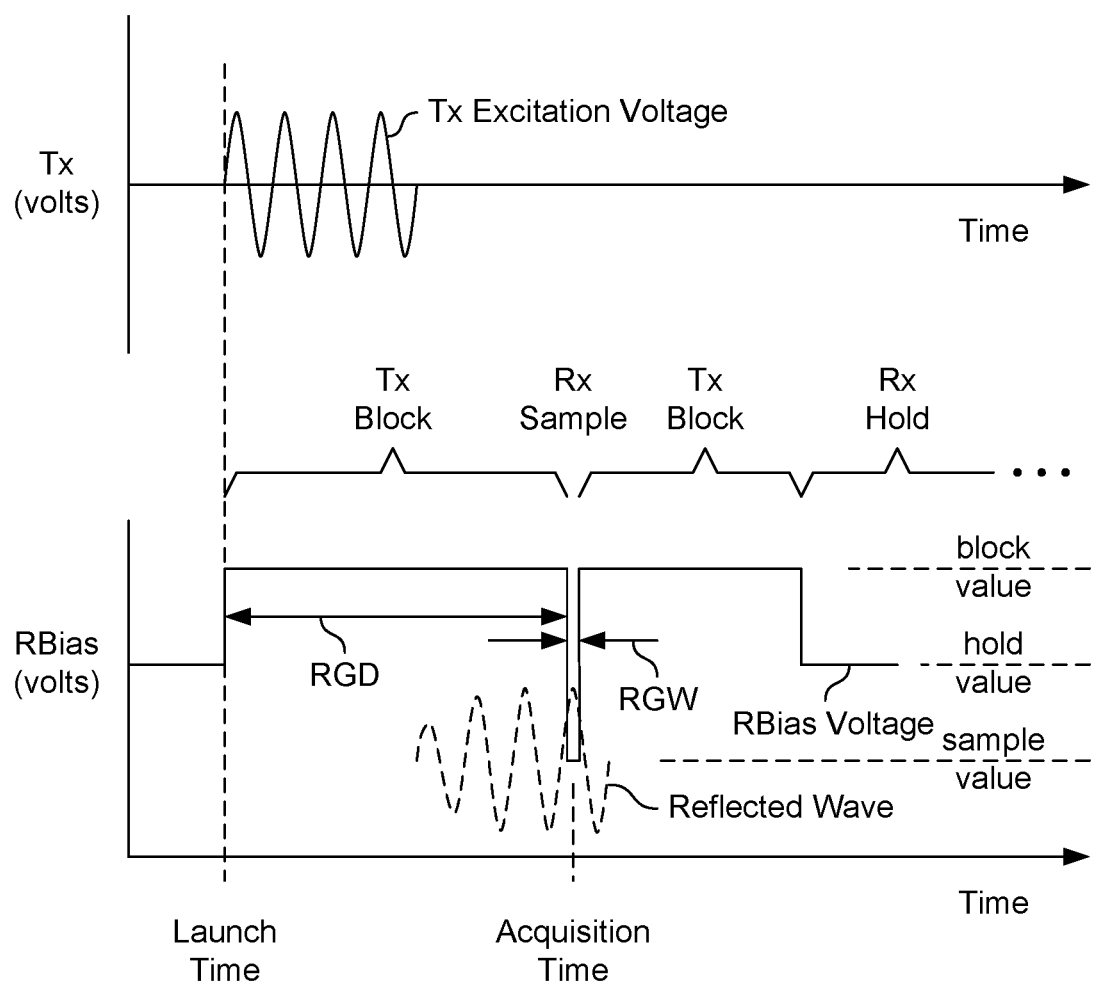

FIGS. 6A-6B graphically illustrate examples of transmitter excitation signals and receiver bias levels as a function of time. The transmitter excitation signals (upper graphs) may be provided to an ultrasonic transmitter, whereas the receiver bias levels (lower graphs) may be applied to a receiver bias electrode of an ultrasonic sensor array. The descriptions below are generic to the various implementations disclosed herein.

FIG. 6A graphically illustrates transmitter (Tx) excitation signals (upper graph) that may be provided to an ultrasonic transmitter, and (lower graph) receiver bias (RBias) voltage levels that may be applied to a receiver bias electrode. For example RBias voltage levels may be applied to the receiver bias electrode 339 (e.g., lower electrode 512 of PMUT 500) of an ultrasonic sensor array 302. One or more cycles of an ultrasonic transmitter excitation signal at a predetermined frequency and scan rate may be applied to the ultrasonic transmitter, as shown in the upper graph of FIG. 6A. One Tx cycle is shown with a solid line, while an additional cycle is shown with a dashed line. In some implementations, a single transmitter excitation cycle may be used. In some implementations, multiple excitation cycles may be used, such as two cycles, three cycles, four cycles, five cycles or more. The transmitter excitation signals in some implementations may be square waves, rectangular waves, partial waves, pulsed waves, multiple-frequency waves, chirped waves, low or high duty-cycle waves, variable-amplitude waves, variable-frequency waves, or other suitable waveform for driving the ultrasonic transmitter 320. During the transmission of the outgoing ultrasonic wave, a control signal may be applied to the receiver bias electrode 339 of the ultrasonic sensor array 302 corresponding to a block mode where the bias level is set to a block value so as to prevent signals reflected from outgoing transmitted waves from being captured by the sensor pixel circuit 536. The reflected ultrasonic signals may be captured during a sample mode, during which the bias level of the control signal applied to the receiver bias electrode 339 is set to a sample value. To prevent detection of unwanted internal reflections, the bias level applied to the receiver bias electrode 339 may be brought back to a block value for a short period of time. During a hold mode where the bias level applied to the receiver bias electrode 339 is brought to a hold value, the signals stored in each sensor pixel of the ultrasonic sensor array may be clocked out. Referring again to FIG. 6A, a first transmitter excitation signal may be applied to the ultrasonic transmitter 320 and the bias level of the sensor array set to a block value at a launch time. After an acquisition time delay, also referred to as a range-gate delay (RGD), the bias level may be brought to a sample value and held there for a duration corresponding to an acquisition time window, also referred to as a sampling window or a range-gate window (RGW). The acquisition time window, in the illustrated implementation, may correspond to a time interval that is longer than or equal to the period of a transmitter excitation cycle. In other implementations, the acquisition time window may be shorter than the period of a transmitter excitation cycle. The period of a transmitter excitation cycle may generally be equal to the period of the corresponding transmitted and reflected ultrasonic waves. After a time interval corresponding to the RGW, the bias level applied to the receiver bias electrode 339 may be returned to the block value. After another time interval, the bias level may be brought to a hold value to allow clocking out of the pixel output signals. For example, an ultrasonic plane wave may be launched at a launch time from an ultrasonic transmitter 320 such as a plane wave generator toward a platen surface. A set of pixel output signals may be acquired at an acquisition time that is delayed from the launch of the ultrasonic plane wave by an acquisition time delay. The pixel output signals may represent local magnitudes of the ultrasonic plane wave at selected times after the plane wave has been reflected from the platen surface. Additional sets of pixel output signals may be acquired after launching additional ultrasonic plane waves. The pixel output signals may be acquired after the same or different acquisition time delays, and with the same or different acquisition time windows. In some implementations, the Tx driver signals (either single-ended or differential) may be applied to one or more upper electrodes (e.g., a transmit electrode) of an associated PMUT or an array of PMUTs. In some implementations, the Tx driver signals may be applied to the lower electrode of an associated PMUT or an array of PMUTs. In some implementations, the RBias voltage may be modulated by the Tx driver signal to generate and launch ultrasonic waves via electrical coupling to an upper or lower electrode of an associated PMUT or PMUT array.

FIG. 6B graphically illustrates multiple cycles of a Tx excitation signal (upper graph) that may be provided to an ultrasonic transmitter and receiver bias levels (lower graph) applied to a receiver bias electrode 339 (e.g., lower electrode 512 of PMUT 500) of an ultrasonic sensor array 302. In the illustrated implementation a reflected wave is detected using a sampling window that is substantially shorter than the period of one cycle of the transmitter excitation signal.

Figure 7A:
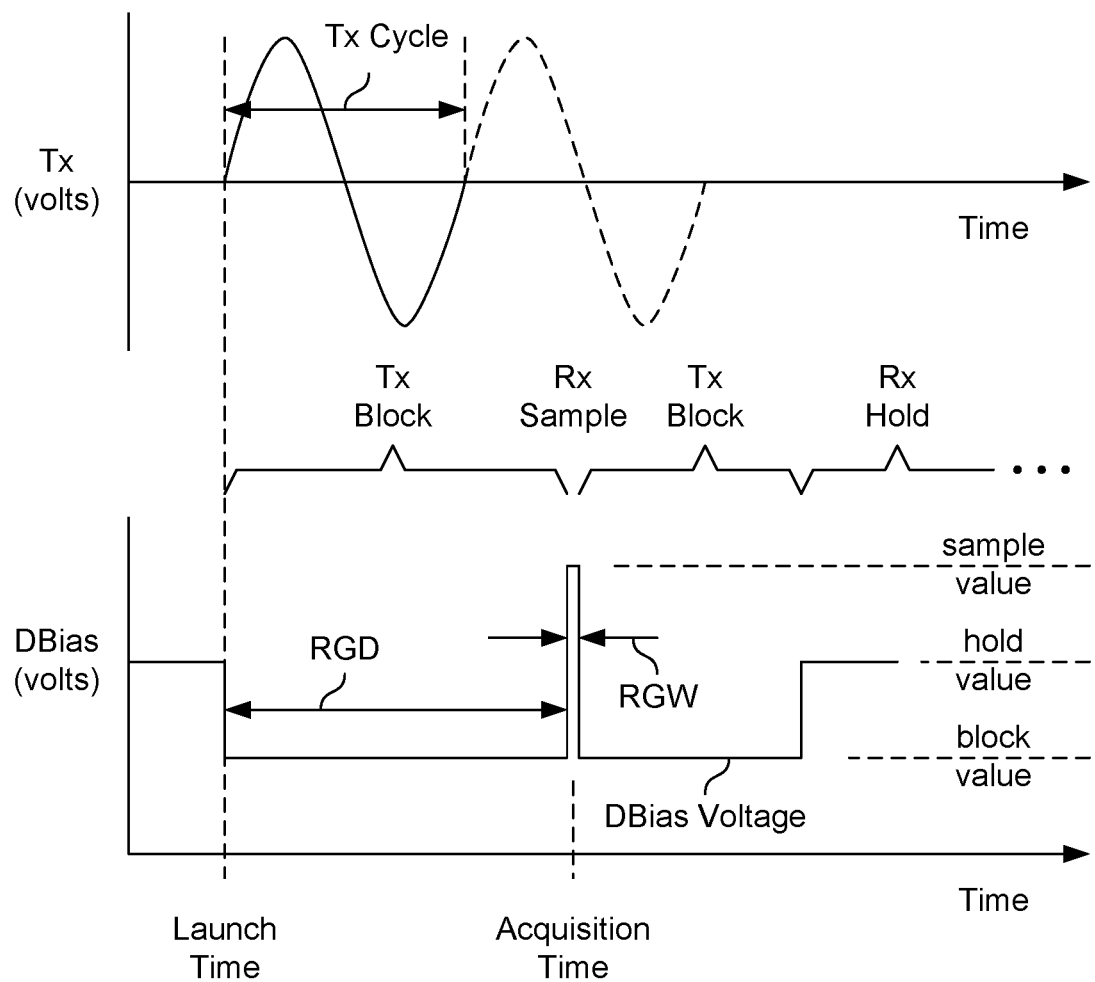
FIGS. 7A-7B graphically illustrate further examples of transmitter excitation signals and diode bias levels as a function of time.
Figure 7B:
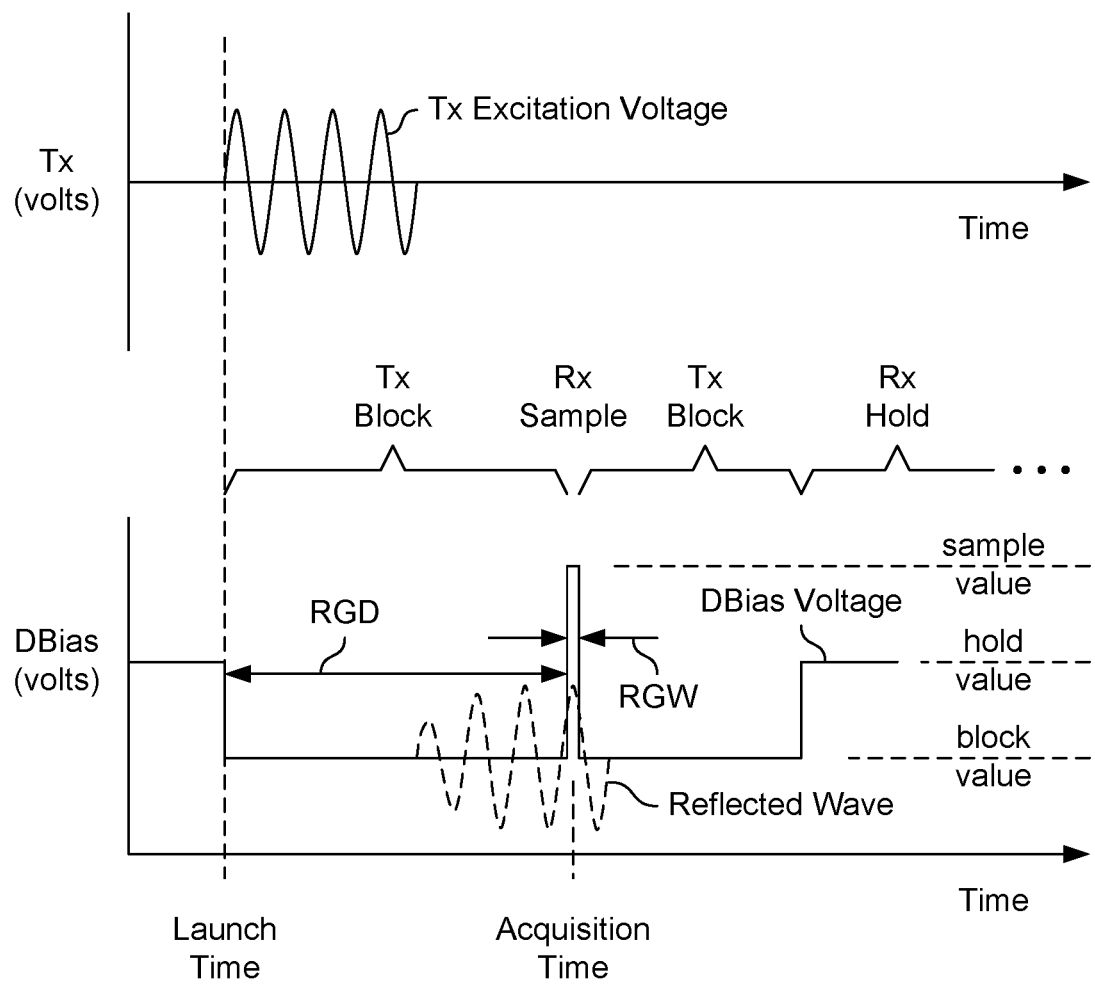

FIGS. 7A-7B graphically illustrate examples of transmitter excitation signals and diode bias levels as a function of time. The transmitter excitation signals (upper graphs) may be provided to an ultrasonic transmitter, whereas the diode bias levels (lower graph) may be applied to a diode bias electrode of an ultrasonic sensor array. One or more cycles of an ultrasonic transmitter excitation signal at a predetermined frequency and scan rate may be applied to the transmitter (Tx), as shown in the top portion of the figure and as described above in connection with FIG. 6A. During the transmission of the outgoing ultrasonic wave, a control signal may be applied to the diode bias electrode 540 corresponding to a block mode where the bias level is set to a block value. The reflected ultrasonic signals may be captured during a sample mode, when the bias level of the control signal applied to the diode bias electrode 540 is set to a sample value. To prevent detection of unwanted internal reflections, the bias level applied to the diode bias electrode 540 may be returned to the block value for a short period of time. During a hold mode where the bias level applied to the diode bias electrode 540 is brought to a hold value, the signals stored in each sensor pixel of the ultrasonic sensor array 302 may be clocked out.

Referring still to FIG. 7A, a first transmitter excitation signal may be applied to the ultrasonic transmitter 320 and the bias level of the diode bias electrode 540 set to a block value at a launch time. After an acquisition time delay, also referred to as a range-gate delay (RGD), the bias level may be brought to a sample value and held there for a duration corresponding to an acquisition time window, also referred to as a range-gate window (RGW). The acquisition time delay, in the illustrated implementation, may correspond to a time interval longer than or equal to the period of a transmitter excitation cycle. In other implementations, the acquisition time window may be shorter than a transmitter excitation cycle. After a time interval corresponding to the acquisition time window, the bias level applied to the diode bias electrode 540 may be brought back to the block value. After another time interval, the bias level may be brought to a hold value to allow clocking out of the pixel output signals. Operation of the diode bias voltages and timing applied to the diode bias electrode 540 to acquire pixel output signals may be generally similar to the voltages and timing applied to the receiver bias electrode 339, as described above in connection with FIG. 6A, although the polarities and magnitude of the voltages may be different between them. In some implementations, the ultrasonic sensor array 302 may be operated in either or both modes for ultrasonic imaging, as desired.

FIG. 7B graphically illustrates multiple cycles of a transmitter excitation signal (upper graph) provided to an ultrasonic transmitter and various RBias levels (lower graph) applied to a diode bias electrode 540. In the illustrated implementation, the RGW may constitute a sampling pulse to detect a reflected wave, with a duration of the sampling pulse or window being substantially shorter than the period of one cycle of the transmitter excitation signal. The sampling pulse may be held active for a duration sufficiently long to detect a strength or magnitude of a reflected ultrasonic wave impinging on a surface of the PMUT. In some implementations, the sample value may be held for a duration (RGW) that is substantially shorter than the period of one cycle of a transmitter excitation signal to serve as a peak detector so that the sensor pixel circuit detects and acquires the peak signal that occurs during the sampling window (which may or may not correspond to the peak strength or magnitude of the reflected ultrasonic wave). In operation, additional images may be acquired with different acquisition time delays (RGDs) from the launch of an ultrasonic wave to capture the signal strength of the reflected ultrasonic wave at various points in time.

Figure 8A:
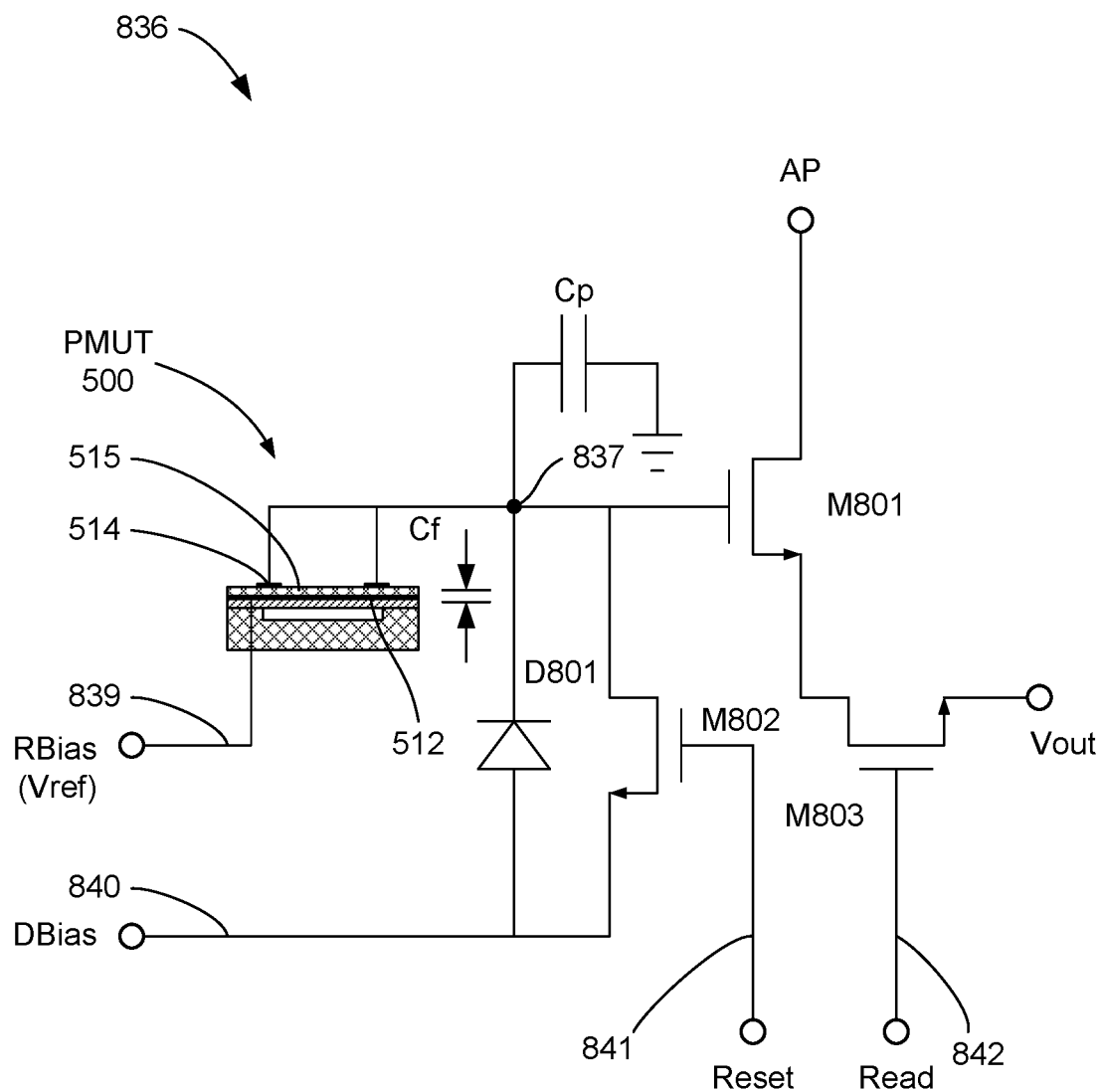
FIG. 8A illustrates an example of a sensor pixel circuit, according to an implementation.

FIG. 8A illustrates an example of a sensor pixel circuit according to an implementation. In the illustrated implementation a sensor pixel circuit 836 (which may be disposed in an array of similar sensor pixel circuits to form a pixel array such as, for example, the ultrasonic pixel circuit array 335 illustrated in FIG. 3 or the ultrasonic pixel circuit array 435 illustrated in FIG. 4.

In the illustrated implementation, the sensor pixel circuit 836 includes the PMUT 500, a diode D801, a transistor M801, a transistor M802, and a transistor M803. The transistor M801 may be responsive to array power (AP) and may serve as a source follower, allowing a signal on the gate of M801 to be transferred to transistor M803 (the "pass transistor M803") and to the output Vout (when the pass transistor M803 is turned on). The diode D801 and the transistor M801 (the "source follower transistor M801") may be responsive to a diode bias voltage. The diode bias voltage level may be applied to the gate of source follower transistor M801 when the diode D801 is forward biased or when the transistor M802 (the "reset transistor M802") is turned on. In the illustrated implementation, gates of the reset transistor M802 and the pass transistor M803 are each coupled with respective gate driver terminals. More particularly, the gate of the reset transistor M802 is coupled with a "Reset" gate driver terminal and the gate of the pass transistor M803 is coupled with a "Read" gate driver terminal.

The diode D801 may be biased using a diode bias (DBias) signal applied, in the illustrated implementation, at a diode bias driver terminal 840. As a result, the diode D801 may be biased into a peak-detecting mode of operation or a rectification mode of operation, as illustrative examples. In some implementations, the DBias signal may be generated by the transceiver circuitry 1010 of FIG. 1 or the sensor controller 304 of FIG. 3. In other implementations, the DBias signal may be generated at another location, such as at the ultrasonic sensor array 302 of FIG. 3.

In accordance with the presently disclosed techniques, ultrasonic signals (e.g., the ultrasonic wave 264 shown in FIG. 2) may be emitted by PMUT 500 as a result of an excitation signal provided by way of Rx bias electrode 839 to the lower electrode 512 of the PMUT 500. The sensor pixel circuit 836 may be responsive to a reflected portion of the ultrasonic wave 264 reflected from a target object 202 (e.g., a finger of a user, as illustrated in FIG. 2, or a stylus) placed on an outer surface of the sensor array. The reflection may generate a charge/voltage in accordance with a piezoelectric effect. For example, the reflection may cause dynamic tensile and compressive mechanical stresses to crystalline structures and/or ceramic structures in the piezoelectric layer 515 of the PMUT 500. The mechanical stress may generate a surface charge or voltage in the upper electrode 514, electrically coupled with pixel input electrode 837, that may be detected by the sensor pixel circuit 836 as described above in connection with FIG. 5. As a result, the sensor pixel circuit 836 may generate a pixel output signal (Vout) having a magnitude or voltage indicating a strength or magnitude of the reflected ultrasonic wave as detected by the sensor pixel circuit 836.

Figure 8B:
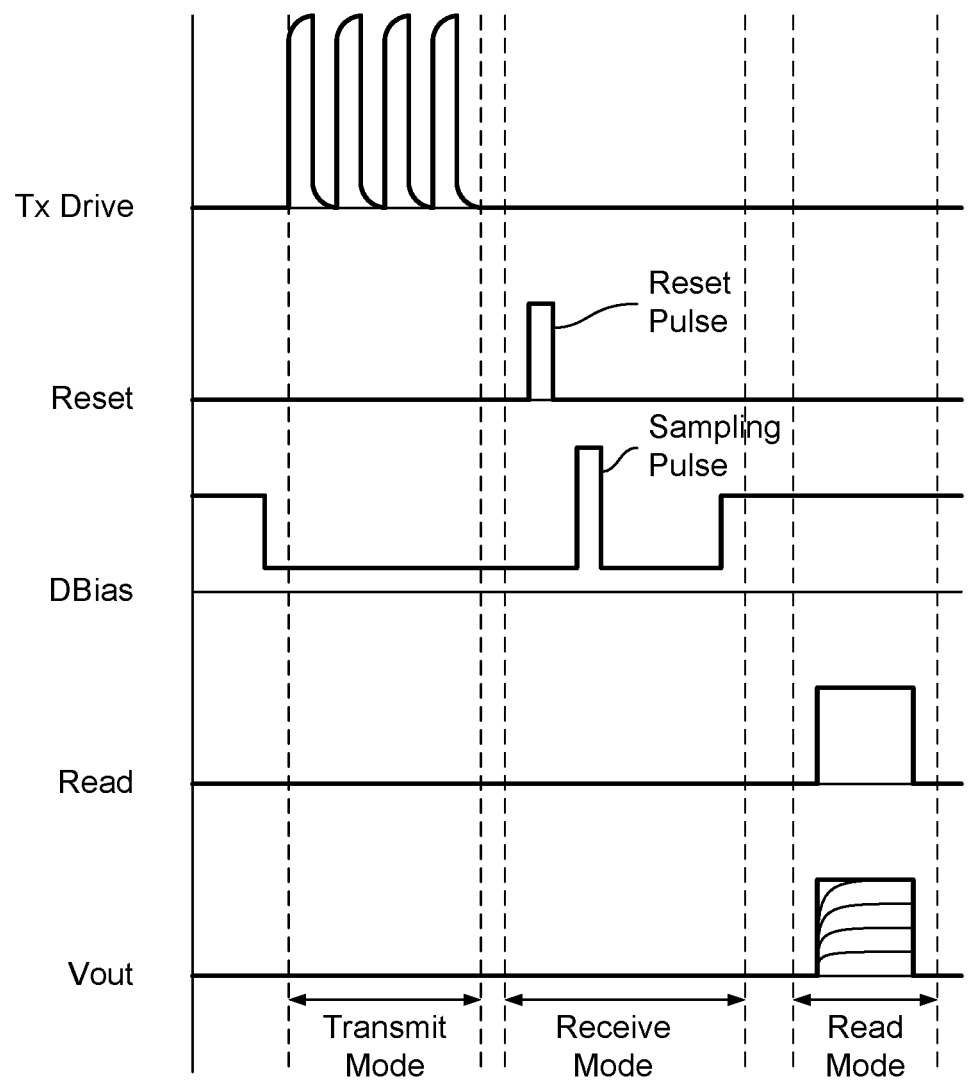
FIG. 8B illustrates an example of a timing diagram for operating the sensor pixel circuit, according to an implementation.

FIG. 8B illustrates an example of a timing diagram for operating the sensor pixel circuit. In the illustrated timing diagram, the sensor pixel circuit 836 may be controlled in three temporally separated modes: a "transmit mode", a "receive mode" and a "read mode". During the transmit mode, ultrasonic signals may be emitted by the PMUT 500 as a result of excitation signals provided by way of the Rx bias electrode 839 to the lower electrode 512 of the PMUT 500. During the receive mode, a reflection of the ultrasonic signals from a target object 202 (e.g., a finger of a user, as illustrated in FIG. 2, or a stylus) may be received by the PMUT 500. The received reflection of the ultrasonic signals may generate a surface charge or voltage in the upper electrode 514 that is coupled with pixel input electrode 837. During the read mode, the readout transistor M803 may be triggered. As a result, Vout, representing a magnitude of reflected ultrasonic signals received by the PMUT 500, may be read by additional circuitry disposed, for example in a sensor controller, such as the sensor controller 304 of FIG. 3. The DBias signal may be applied to the diode bias driver terminal 840 as a sampling pulse as described above in connection with FIG. 7B, in some implementations.

In some implementations, the sensor controller 304 may be configured to selectively initiate the transmit mode of operation, the receive mode of operation, and the read mode of operation at the ultrasonic sensor array 302 by appropriately signaling the Rx bias electrode 839, the diode bias driver terminal 840, a reset terminal 841 and a read driver terminal 842 of the sensor pixel circuit 836.

In the implementation illustrated in FIG. 8A, the PMUT 500 includes two terminals (or "ports"): the lower electrode 512 and the upper electrode 514. As a result, the PMUT 500 may be referred to as a two-port PMUT. As disclosed by the present Applicant in U.S. patent application Ser. No. 14/883, 583, filed on Oct. 14, 2015 and entitled "THREE-PORT PIEZOELECTRIC ULTRASONIC TRANSDUCER" a PMUT may be configured as a three-terminal device configured to simultaneously transmit first ultrasonic signals by way of a first electrode and to receive second ultrasonic signals by way of a second electrode, where a third electrode serves as a reference and/or ground electrode. In some implementations, a three-port PMUT has an electrical input (Tx) port, an ultrasonic output port (serving also as an ultrasonic input port), and an electrical output (Rx) port. In such implementations, the electrical input port and the electrical output port may be physically and electrically separated and yet may be disposed on the same portion of the PMUT microstructure (e.g., on the diaphragm above the cavity).

Figure 9A:
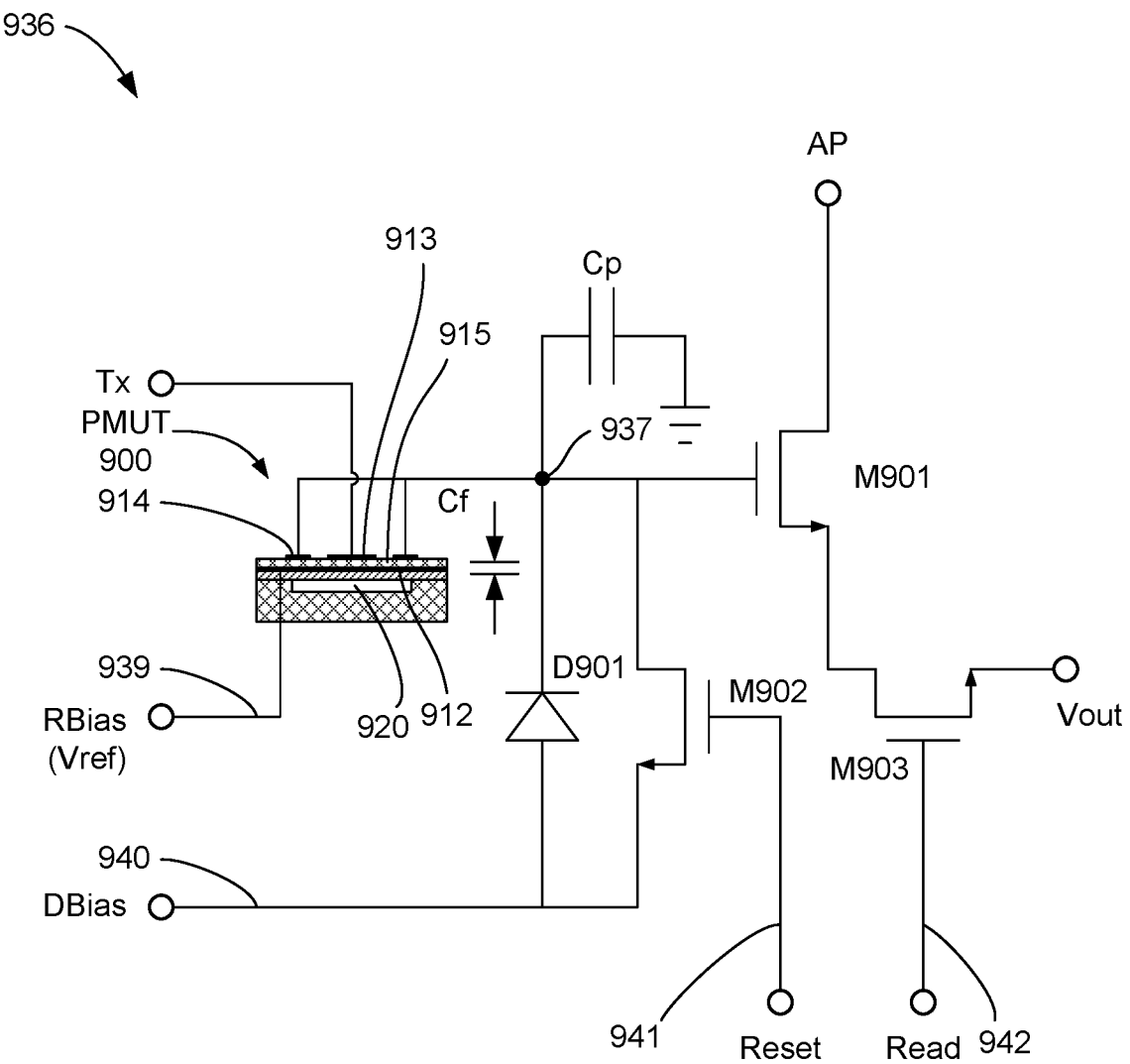
FIG. 9A illustrates an example of a sensor pixel circuit incorporating a three-port PMUT, according to an implementation.

FIG. 9A illustrates an example of a sensor pixel circuit incorporating a three-port PMUT, according to an implementation. In the illustrated implementation, PMUT 900 includes a reference (lower) electrode 912 disposed below a piezoelectric layer 915 and above a cavity 920. An inner (upper) electrode 913 is disposed above the piezoelectric layer 915. In the illustrated implementation, one or more outer (upper) electrodes 914 are also disposed above the piezoelectric layer 915. These outer electrodes 914 may be electrically connected together by extending the outer electrode 914 partially or completely around the perimeter of the three-port PMUT 900 in one example, or by interconnecting segmented outer electrodes 914 externally with one or more electrical interconnects or jumpers in another example. In the illustrated implementation, the inner electrode 913 is configured as a "transmit electrode", and the outer electrode 914 is configured as a "receive electrode". In alternative implementations (not illustrated), the inner electrode 913 may be configured as the receive electrode, and the outer electrode(s) 914 may be configured as the transmit electrode. The sensor pixel circuit 936 may be disposed in an array of similar pixel circuits to form a pixel array such as, for example, the ultrasonic pixel circuit array 335 illustrated in FIG. 3 or the ultrasonic pixel circuit array 435 illustrated in FIG. 4.

In the illustrated implementation, the sensor pixel circuit 936 includes the PMUT 900, a diode D901, a transistor M901, a transistor M902, and a transistor M903. The transistor M901 may be responsive to array power (AP) and may serve as a source follower, allowing a signal on the gate of M901 to be transferred to transistor M903 (the "pass transistor M903") and to the output Vout (e.g., when the pass transistor M903 is turned on). The diode D901 and the transistor M901 (the "source follower transistor M901") may be responsive to a diode bias voltage. The diode bias voltage level may be applied to the gate of source follower transistor M901 when the diode D901 is forward biased or when the transistor M902 (the "reset transistor M902") is turned on. In the illustrated implementation, gates of the reset transistor M902 and the pass transistor M903 are each coupled with respective gate driver terminals. More particularly, the gate of the reset transistor M902 is coupled with a "Reset" gate driver terminal and the gate of the pass transistor M903 is coupled with a "Read" gate driver terminal.

The diode D901 may be biased using the diode bias signal, such that the diode D901 is biased into a peak-detecting mode of operation or a rectification mode of operation, as illustrative examples. In some implementations, the diode bias signal may be generated by the transceiver circuitry 1010 of FIG. 1 or the sensor controller 304 of FIG. 3. In other implementations, the diode bias signal may be generated at another location, such as at the ultrasonic sensor array 302 of FIG. 3.

In accordance with the presently disclosed techniques, ultrasonic signals (e.g., the ultrasonic wave 264 shown in FIG. 2) may be emitted by PMUT 900 as a result of an excitation signal provided by way of a Tx drive electrode to inner (transmit) electrode 913. The sensor pixel circuit 936 may be responsive to a reflected portion of the ultrasonic wave 264 reflected from a target object 202 (e.g., a finger of a user, as illustrated in FIG. 2, or a stylus) placed on an outer surface of the sensor array. The reflection may generate a charge/voltage in accordance with a piezoelectric effect. For example, the reflection may cause dynamic tensile and compressive mechanical stresses to crystalline structures and/or ceramic structures in the piezoelectric layer 915 of the PMUT 900. The mechanical stress may generate a surface charge or voltage in the outer (receive) electrode 914, electrically coupled with pixel input electrode 937, that may be detected by the sensor pixel circuit 936 as described above in connection with FIG. 5. As a result, the sensor pixel circuit 936 may generate a pixel output signal (Vout) having a magnitude or voltage indicating a strength or magnitude of the reflected ultrasonic wave as detected by the sensor pixel circuit 936.

Figure 9B:
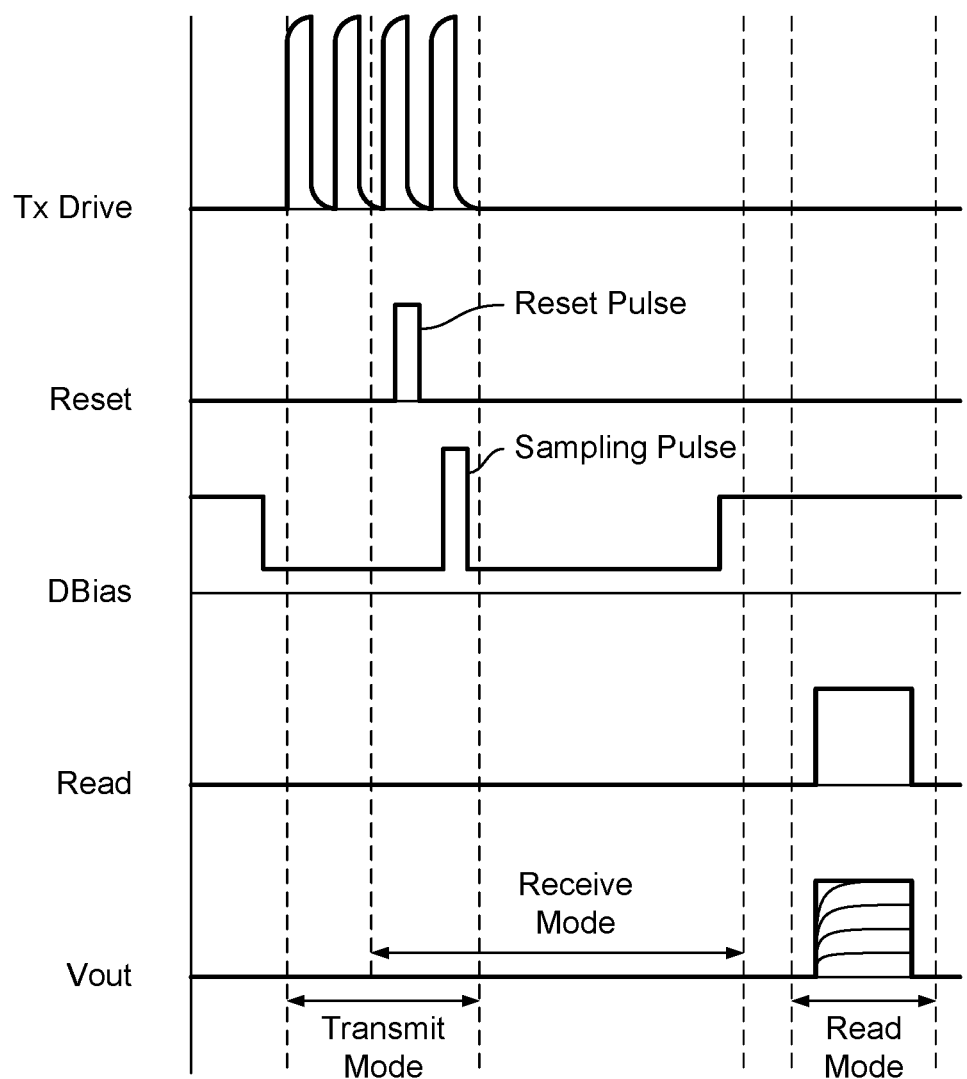
FIG. 9B illustrates an example of a timing diagram for operating the sensor pixel circuit incorporating the three-port PMUT, according to an implementation.

FIG. 9B illustrates an example of a timing diagram for operating the sensor pixel circuit incorporating the three-port PMUT, according to an implementation. In the illustrated timing diagram, the sensor pixel circuit 936 may be controlled in three modes: a "transmit mode", a "receive mode" (that may at least partially overlap the transmit mode) and a "read mode". During the transmit mode, ultrasonic signals may be emitted by the PMUT 900 as a result of excitation signals provided by way of the Tx drive electrode to the transmit electrode 913. During the receive mode, a reflection of the ultrasonic signals from a target object 202 (e.g., a finger of a user, as illustrated in FIG. 2, or a stylus) may be received by the PMUT 900. The received reflection of the ultrasonic signals may generate a surface charge or voltage in the receive electrode 914 that is coupled with pixel input electrode 937. During the read mode, the readout transistor M903 may be triggered. As a result, Vout, representing a magnitude of reflected ultrasonic signals received by the PMUT 900, may be read by additional circuitry disposed, for example in a sensor controller, such as the sensor controller 304 of FIG. 3. The DBias signal may be applied to the diode bias driver terminal 940 as a sampling pulse as described above in connection with FIG. 7B, in some implementations.

In some implementations, the sensor controller 304 may be configured to selectively initiate the transmit mode of operation, the receive mode of operation, and the read mode of operation at the ultrasonic sensor array 302 by appropriately signaling the Rx bias electrode 939, the diode bias driver terminal 940, a reset terminal 941 and a read driver terminal 942 of the sensor pixel circuit 936.

In some implementations, a two-level bias scheme may be used. For example, the multiple levels of temporally separated bias voltages may correspond to a hold value and a sample value. The sample value may be held for a duration corresponding to an acquisition time window sufficiently long to detect a strength or magnitude of a reflected ultrasonic wave impinging on a surface of the PMUT 900. In some implementations, the sample value may be held for a duration that is substantially shorter than the period of one cycle of a transmitter excitation signal to serve as a peak detector so that the sensor pixel circuit detects and acquires the peak signal that occurs during the acquisition time window (which may or may not correspond to the peak strength or magnitude of the reflected ultrasonic wave). The bias signals may correspond to various receiver bias voltage levels and applied to the reference (lower) electrode or to the transmit electrode of the PMUT. Alternatively, the bias signals may correspond to various diode bias voltage levels and may be applied to a diode terminal (e.g., the anode) of the rectifying diode in the sensor pixel circuit. In some two-level bias scheme implementations, the block mode may be omitted and replaced by a fast reset signal applied to the reset terminal of the sensor pixel circuit. The reset signal may be applied between the time that the ultrasonic wave is launched and the reflected ultrasonic wave is detected by the sensor pixel circuit.

While sensor pixel circuits having a diode and several transistors in each pixel circuit are described above, other sensor pixel circuits may be contemplated with or without a rectifying diode, with more or fewer silicon or thin-film transistors, and with more or less functionality than that described above. For example, the sensor pixel circuit may include one or more peak voltage detectors, peak-to-peak voltage detectors, sample-and-hold circuits, envelope detectors, or charge integrators. While the pixel circuits described above and detailed in the process descriptions described below generally pertain to TFT circuitry formed on glass or plastic substrates, silicon- or semiconductor-based transistor circuitry such as CMOS circuitry formed on silicon or SOI substrates may be constructed with similar or enhanced performance and functionality.

FIGS. 10A-10D illustrate selected features of an array of two-port PMUT elements, according to some implementations. Each two-port PMUT element includes an upper electrode 1014 and a lower electrode 1012 disposed over a cavity region 1020. In an example implementation illustrated in FIG. 10A, each PMUT element in a row of PMUT elements is electrically coupled by a common lower (reference) electrode 1012*a* that may receive a common RBias input. In the illustrated implementation, each upper electrode 1014*a* is configured as a centrally disposed drive/sense electrode and is individually coupled by a respective pixel input electrode 1037*a* to an associated sensor pixel circuit (not illustrated).

Figure 10A:
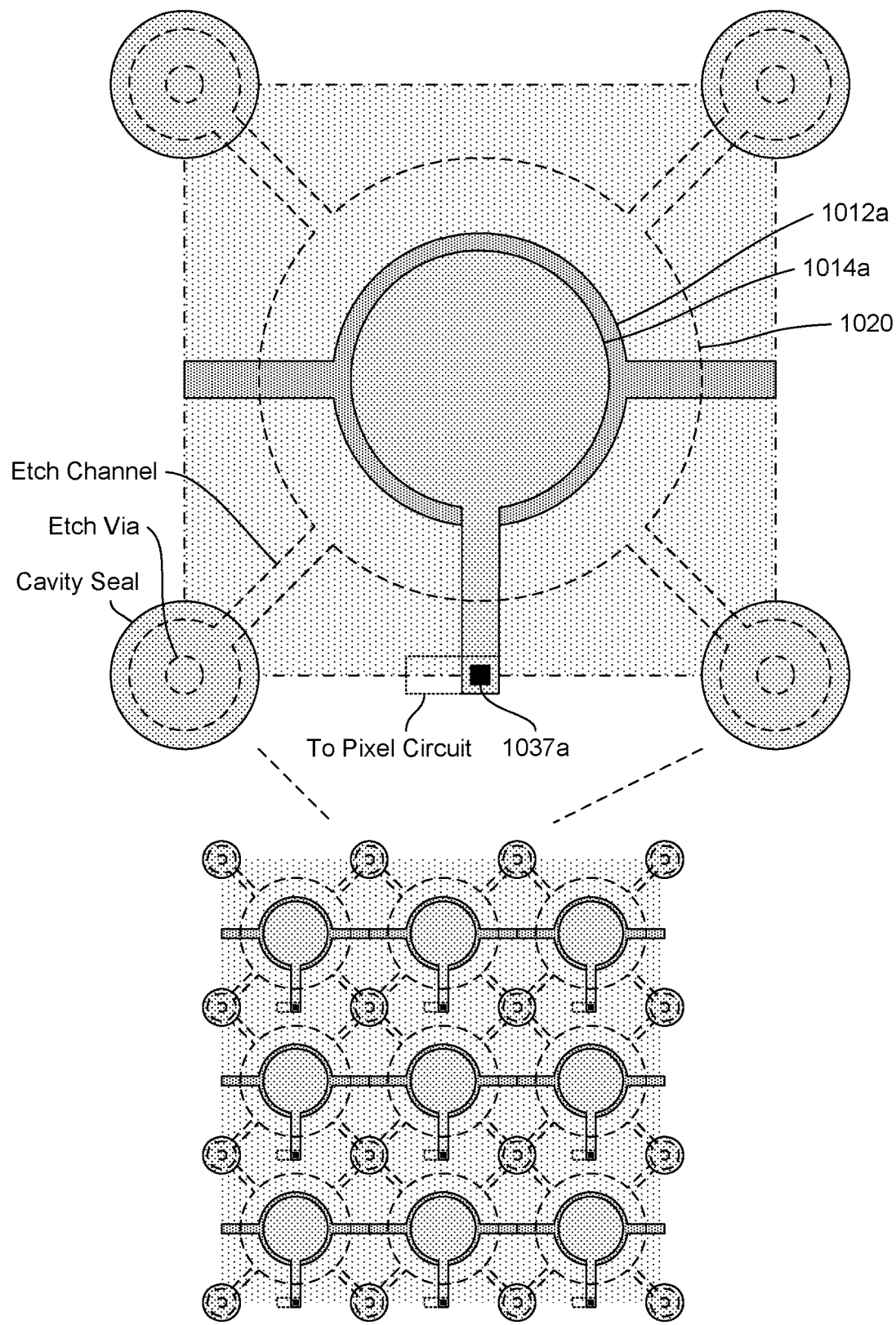
FIGS. 10A-10D illustrate selected features of an array of two-port PMUT elements, according to some implementations.
Figure 10B:
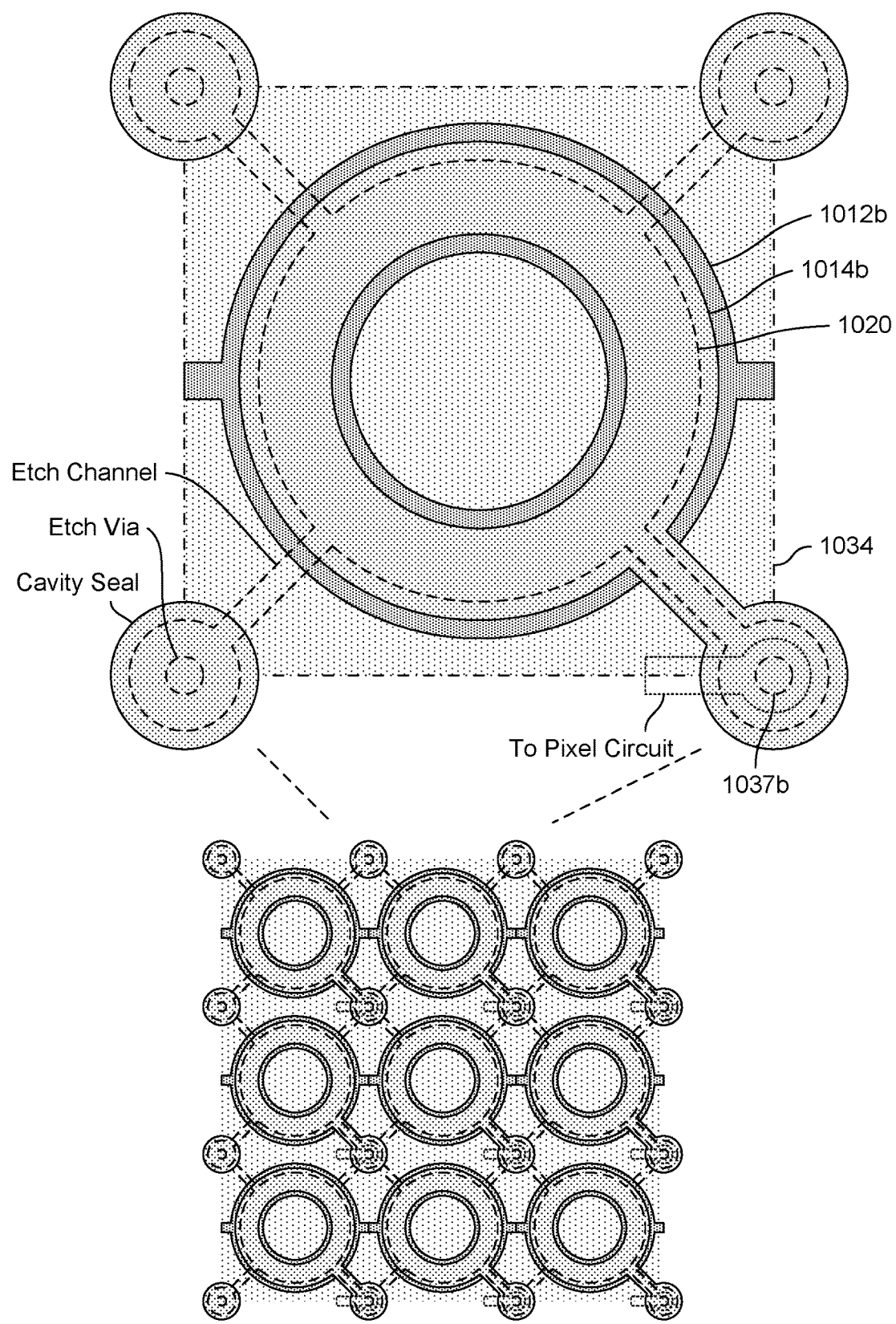

In an example implementation illustrated in FIG. 10B, each PMUT element in a row of PMUT elements is electrically coupled by a common lower (reference) electrode 1012*b* that may receive a common RBias input. In the illustrated implementation, each upper electrode 1014*b* is configured as a peripherally disposed (ring) drive/sense electrode and is individually coupled by a respective pixel input electrode 1037*b* to an associated sensor pixel circuit (not illustrated).

Figure 10C:
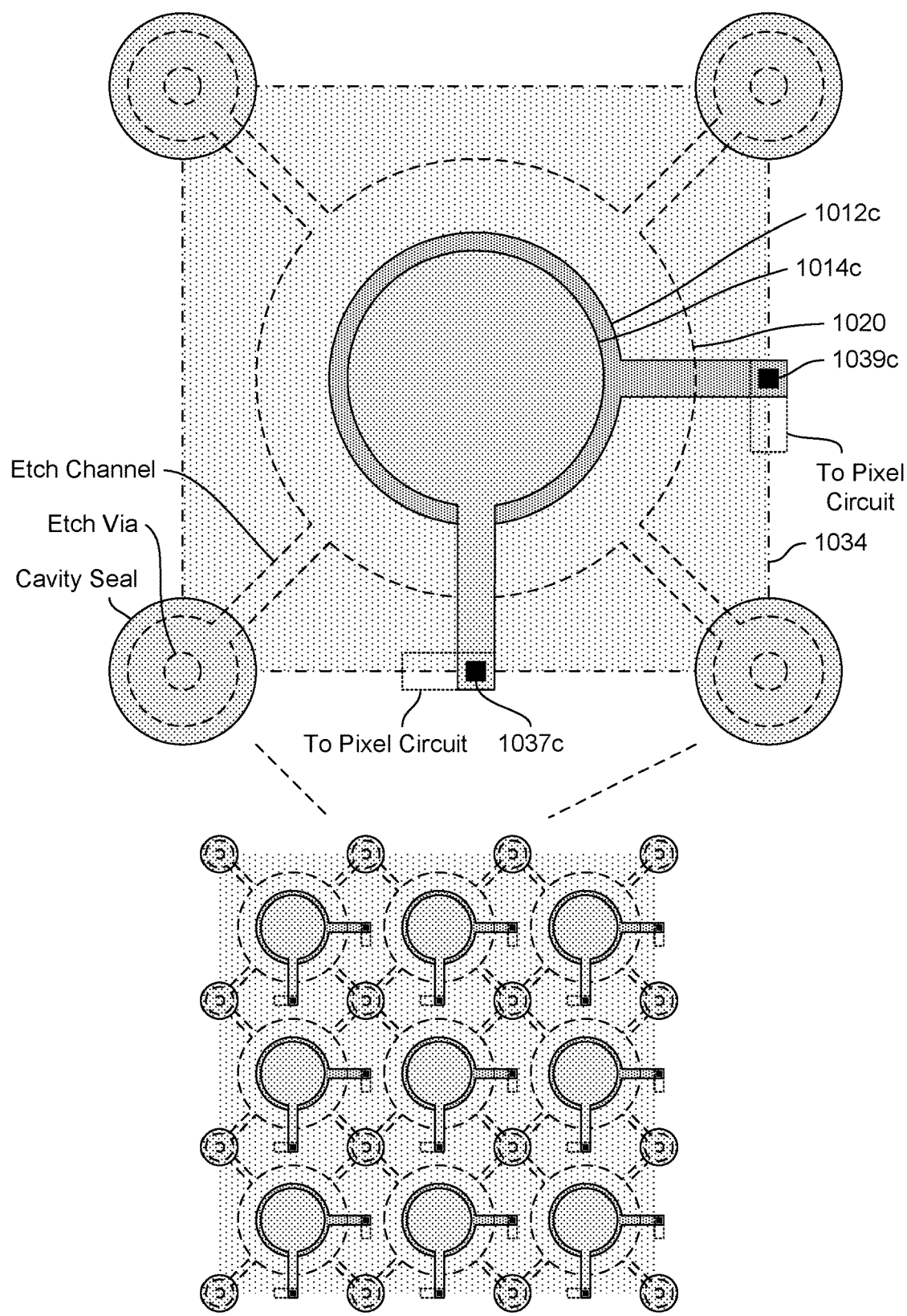

In an example implementation illustrated in FIG. 10C, each lower (reference) electrode 1012*c* is individually coupled with a respective Rx bias electrode 1039*c*. In the illustrated implementation, each upper electrode 1014*c* is configured as a centrally disposed drive/sense electrode and is individually coupled by a respective pixel input electrode 1037*c* to an associated sensor pixel circuit (not illustrated).

Figure 10D:
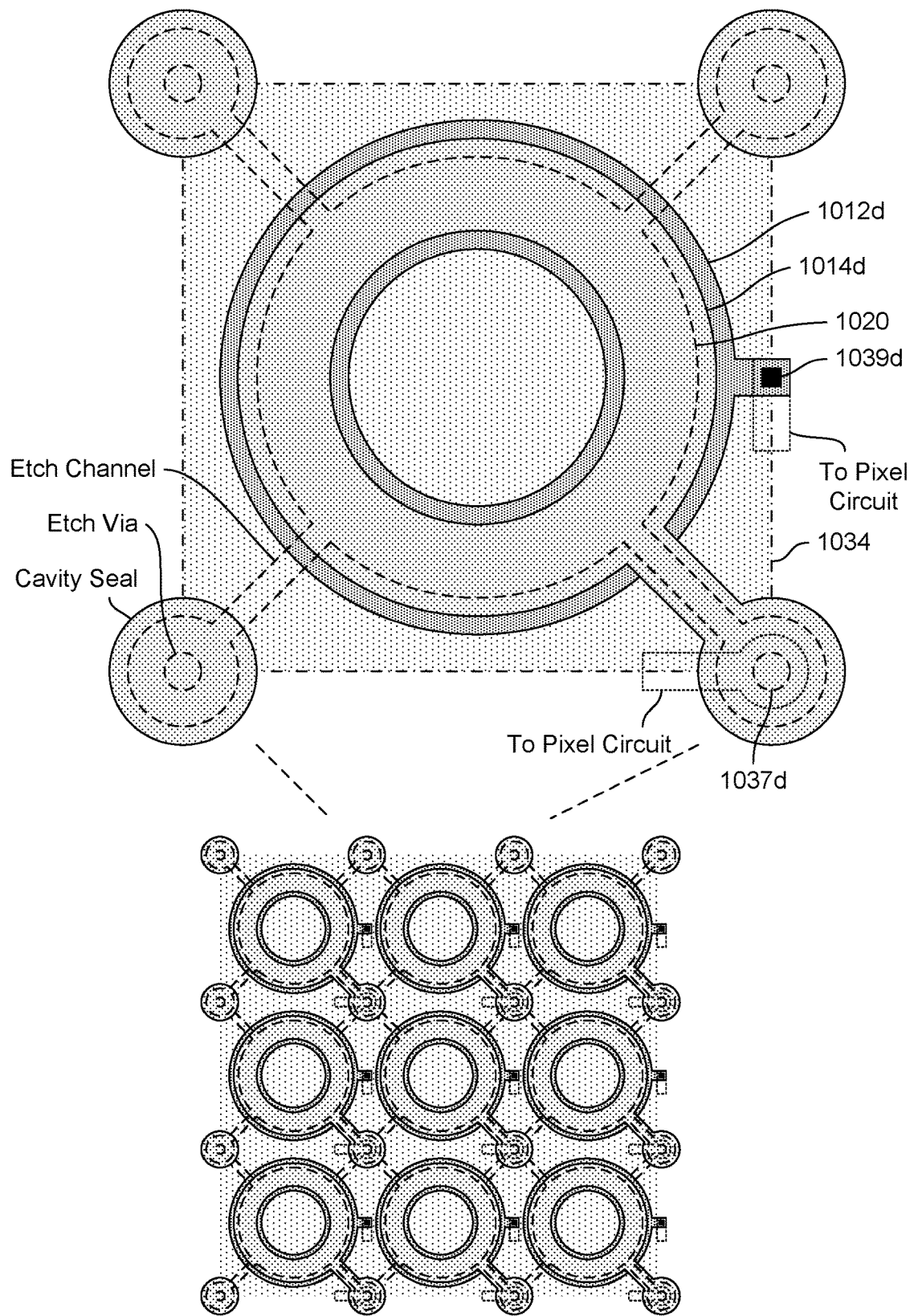

In an example implementation illustrated in FIG. 10D, each lower (reference) electrode 1012*d* is individually coupled with a respective Rx bias electrode 1039*d*. In the illustrated implementation, each upper electrode 1014*d* is configured as a peripherally disposed (ring) drive/sense electrode and is individually coupled by a respective pixel input electrode 1037*d* to an associated sensor pixel circuit (not illustrated).

Figure 11A:
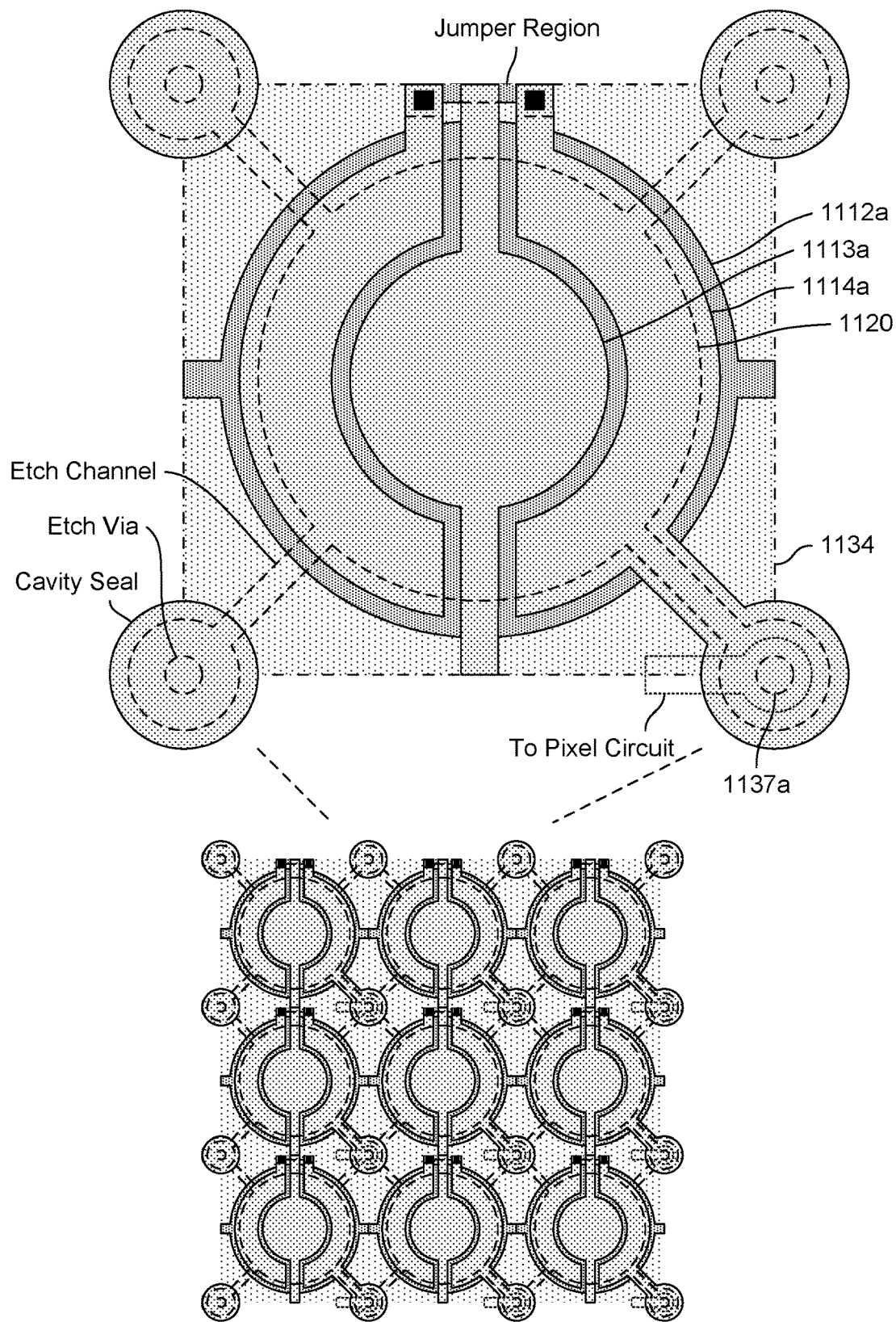
FIGS. 11A-11B illustrate selected features of an array of three-port PMUT elements, according to some implementations.
Figure 11B:
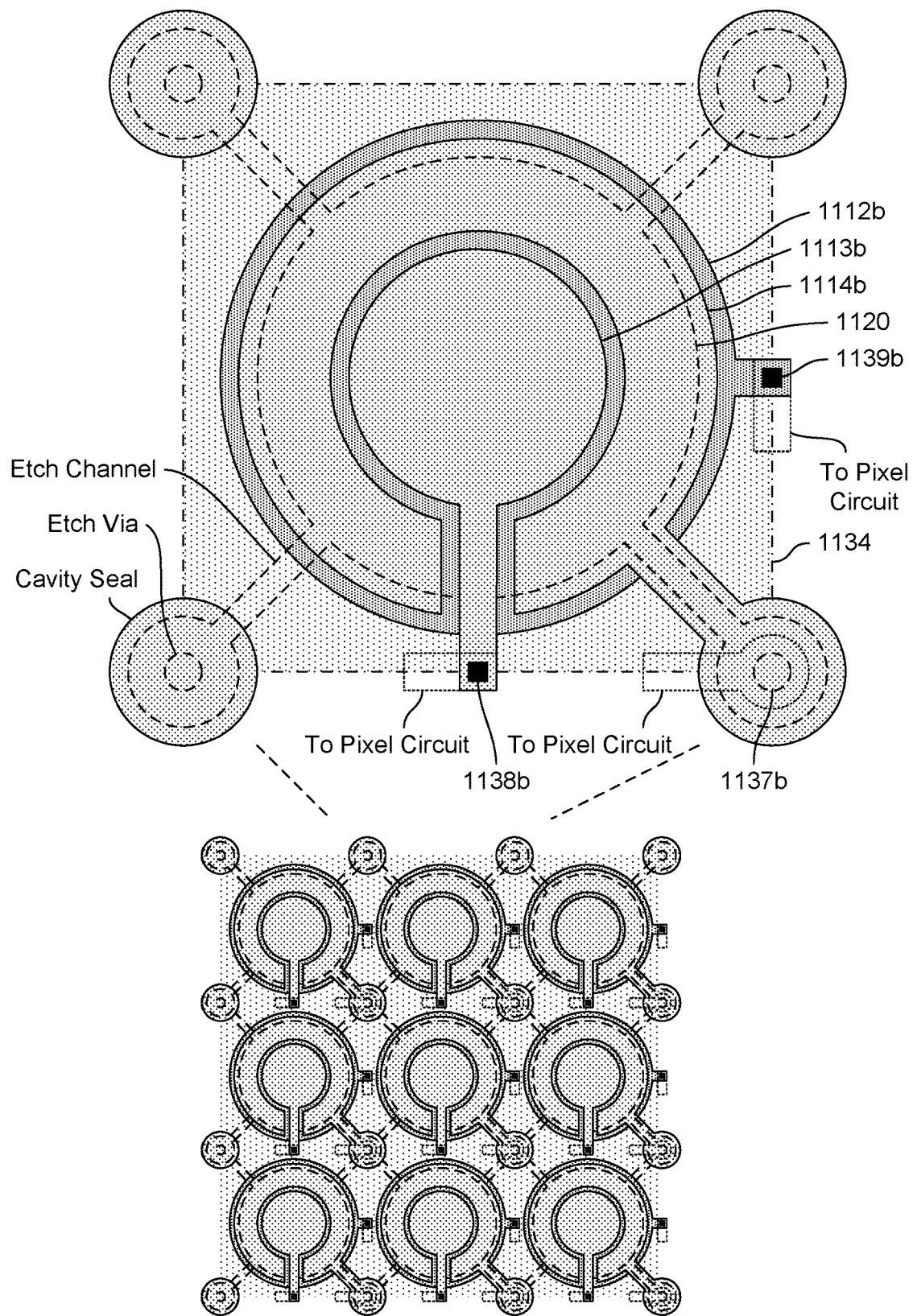

FIGS. 11A-11B illustrate selected features of an array of three-port PMUT elements, according to some implementations. Each three-port PMUT element includes a lower (reference) electrode 1112, a first upper electrode 1113, and a second upper electrode 1114 disposed over a cavity region 1120. In an example implementation illustrated in FIG. 11A, each PMUT element in a row of PMUT elements is electrically coupled by a common lower (reference) electrode 1112*a* that may receive a common reference and/or ground voltage. In the illustrated implementation, each PMUT element in a column of PMUT elements is electrically coupled together by the first upper (drive) electrode 1113*a* that may receive a common excitation (Tx Drive) signal. In the illustrated implementation, the second upper (receive) electrode 1114*a* is configured as a peripherally disposed outer electrode and is individually coupled by a respective pixel input electrode 1137*a* to an associated sensor pixel circuit (not illustrated). In the illustrated implementation, the second upper electrode 1114*a* includes two portions, electrically coupled at a jumper region.

In an example implementation illustrated in FIG. 11B, each lower (reference) electrode 1112*b* of each PMUT element is individually electrically coupled with a reference and/or ground voltage. In the illustrated implementation, each first upper (drive) electrode 1113*b* of each PMUT element may be individually electrically coupled with an excitation (Tx Drive) signal. In the illustrated implementation, the second upper (receive) electrode 1114*b* is configured as a peripherally disposed outer electrode and is individually coupled by a respective pixel input electrode 1137*b* to an associated sensor pixel circuit (not illustrated).

Figure 12A:
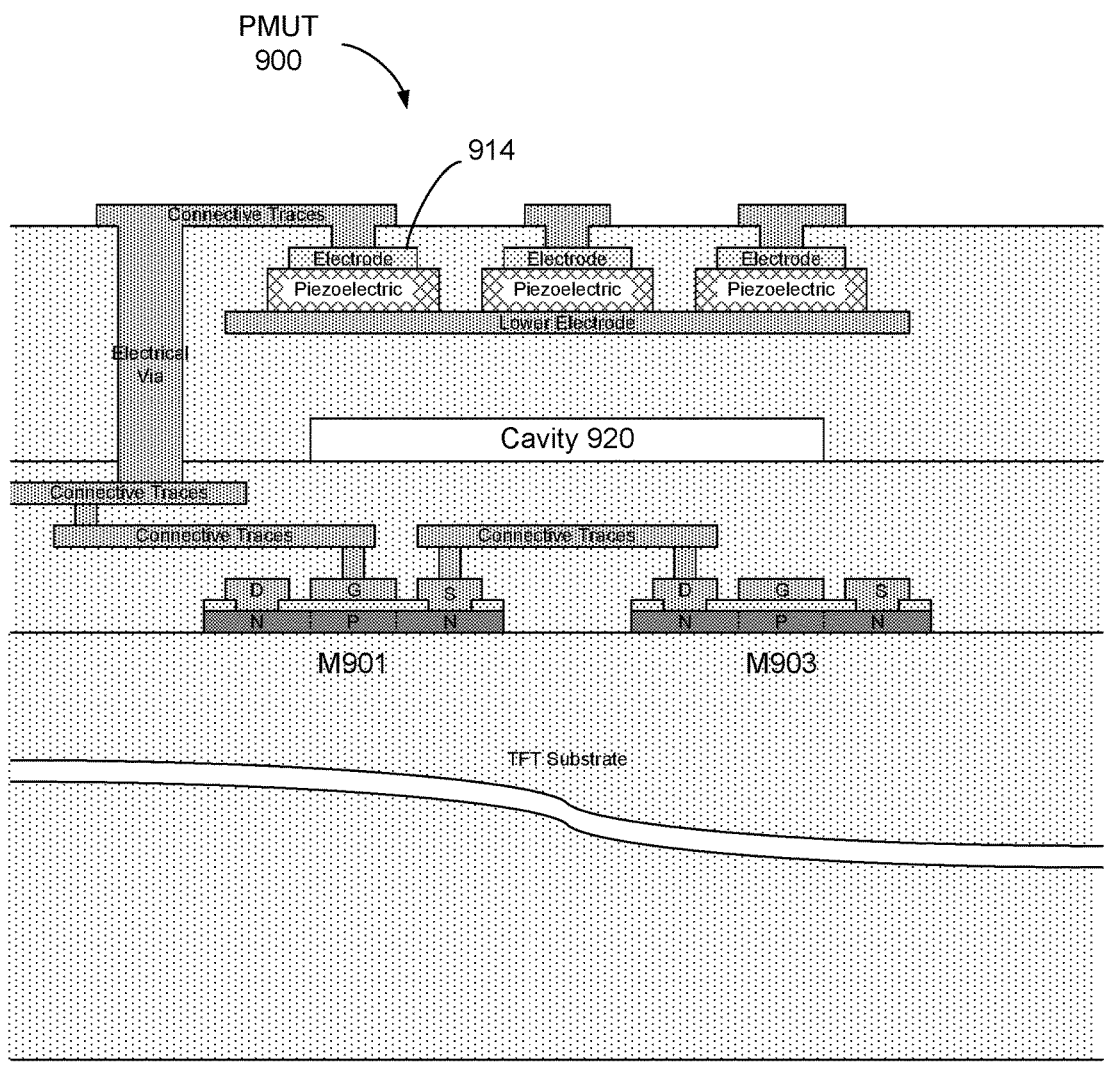
FIGS. 12A-12C illustrate examples of simplified cross sections of a PMUT element integrated with a TFT substrate having amorphous or polycrystalline silicon thin-film transistors.
Figure 12B:
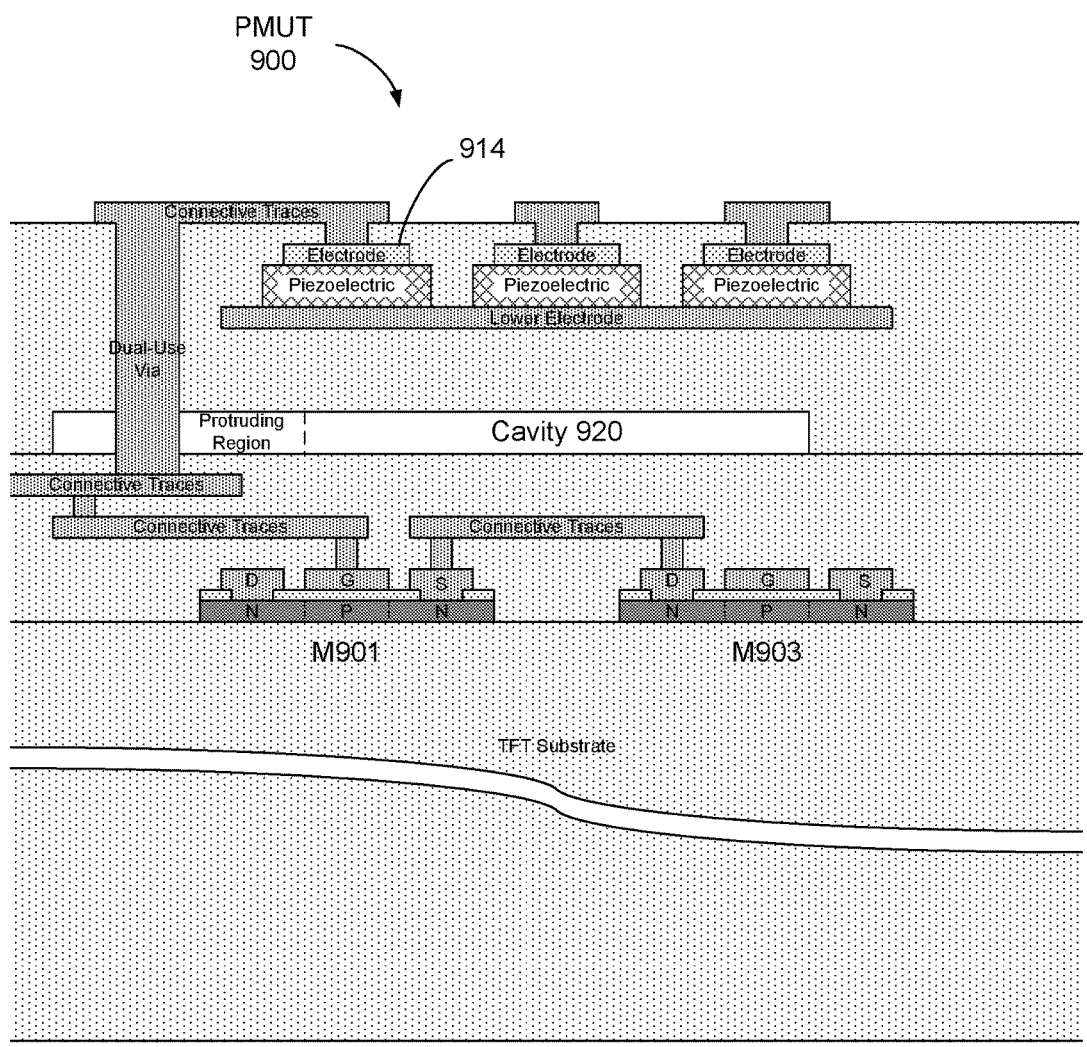
Figure 12C:
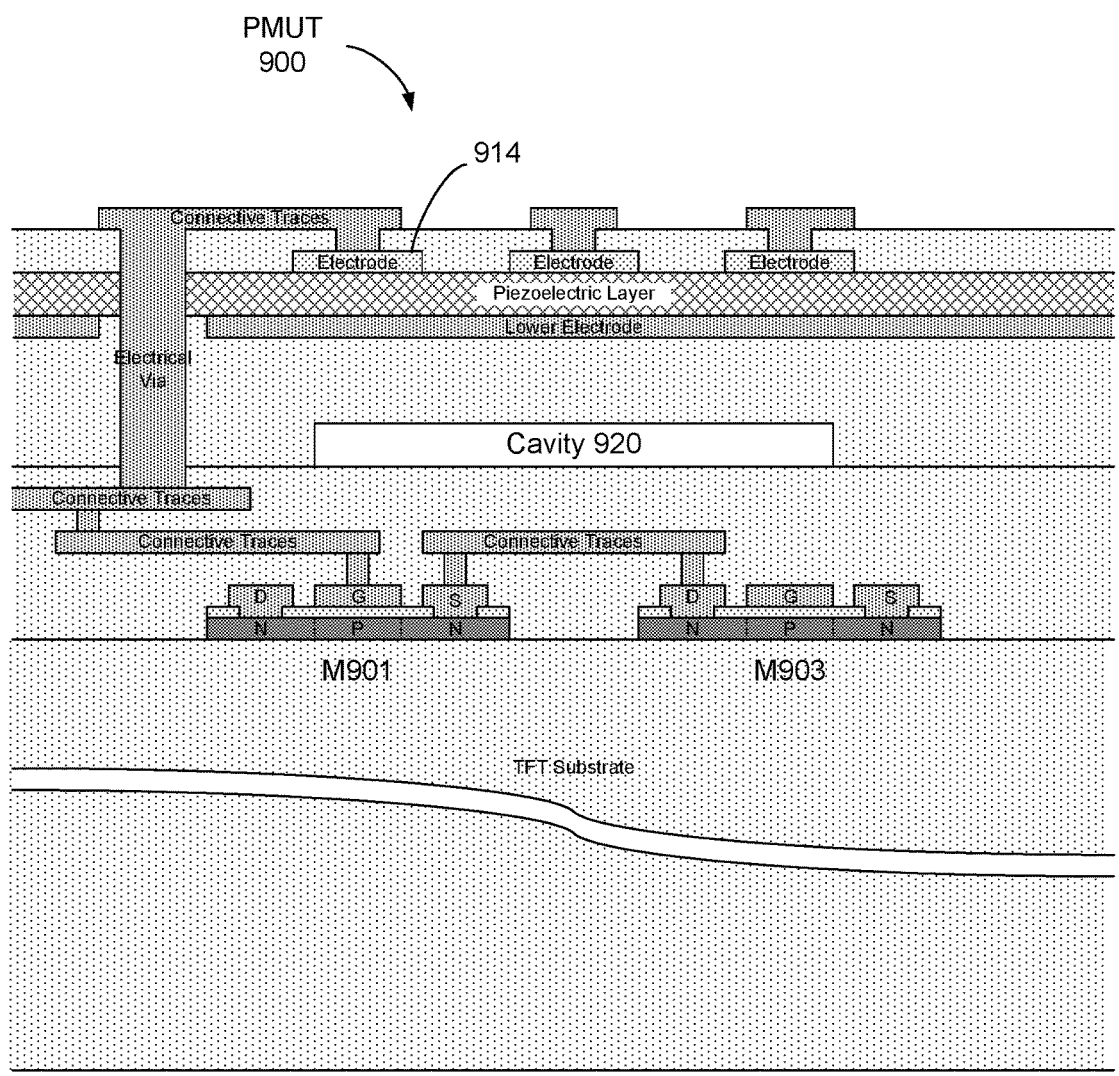

FIGS. 12A-12C illustrate examples of simplified cross sections of a PMUT element integrated with a TFT substrate having amorphous or polycrystalline silicon thin-film transistors. Referring to FIG. 12A, it may be observed that an upper electrode of 914 of the PMUT 900 is electrically coupled with a gate terminal of a transistor M901 by way of a sequence of connective traces and an electrical via. In the illustrated implementation a drain terminal of the transistor M901 electrically coupled by way of a connective trace with a source terminal of a transistor M903. It will be appreciated that the illustrated cross-section is a simplified conceptual representation and that a sensor pixel circuit including a complex arrangement of multiple transistors, diodes and capacitive elements may be disposed beneath the PMUT 900 proximate to the illustrated components and share substantially the same footprint as the PMUT 900.

Referring now to FIG. 12B, an implementation is illustrated in which cavity 920 is depicted as including a protruding etch channel region that is coupled with a dual-use via. The PMUT 900 may include one or more dual-use vias that serve as an interlayer electrical connector and as a seal for cavity 920. During a fabrication process, prior to depositing a conductive trace in the dual-use via, the cavity 920 may be formed by removing a sacrificial material from the cavity 920 through a via hole and the protruding etch channel region. A metal layer may be deposited that fills the via hole and a portion of the protruding etch channel region, simultaneously sealing the cavity 920 and allowing for electrical interconnects between connective traces above the cavity 920 and connective traces below the cavity 920.

In some implementations, the lower electrode layer may span the cavity and extend to or nearly to a side of the PMUT 900, as shown in FIG. 12C. For example, a lower electrode layer that spans most of the PMUT footprint may serve as a bias layer and as an effective electrostatic shield. In a similar manner, the piezoelectric layer may span the cavity and extend to or nearly to each side of the PMUT 900. Holes and other cutout portions of the lower electrode layer and the piezoelectric layer may be formed as needed to allow traversing of vias and other electrical traces.

In alternate configurations (not shown), the reference electrode may be positioned on a side of the piezoelectric layer furthest from the cavity, and the receive and/or transmit electrodes positioned on the opposite side of the piezoelectric layer nearest the cavity. In some implementations, the reference electrode may continuously span the cavity, while in other implementations, the reference electrode may be segmented with each segment spanning a portion of the cavity.

Figure 13:
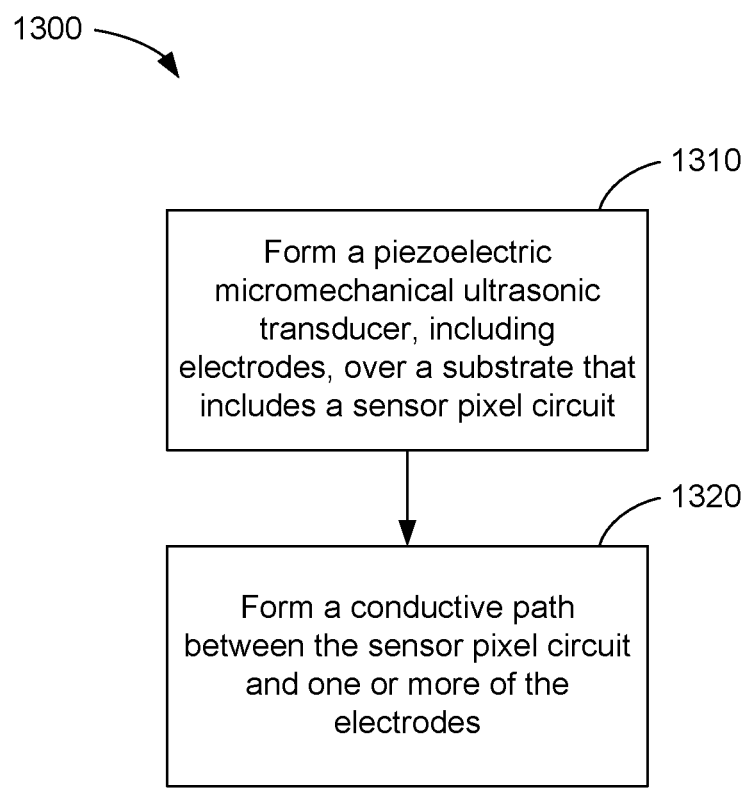
FIG. 13 illustrates an example of a process flow for fabricating an ultrasonic sensor pixel.

FIG. 13 illustrates an example of a process flow for fabricating an ultrasonic sensor pixel. Method 1300 includes a step 1310 for forming a piezoelectric micromechanical ultrasonic transducer (PMUT), including electrodes, over a substrate that includes a sensor pixel circuit. As described hereinabove, the PMUT may include a piezoelectric layer stack including a piezoelectric layer disposed over a cavity. The electrodes may include a reference electrode disposed between the piezoelectric layer stack and the cavity, and one or both of a receive electrode and a transmit electrode disposed on or proximate to a surface of the piezoelectric layer stack that is opposite from the cavity. The PMUT may overlay the sensor pixel circuit, such that the sensor pixel circuit and the PMUT are contained within a common footprint area. Advantageously, the sensor pixel circuit may be contained within a first footprint area and the PMUT may be contained within a second footprint area, the first footprint area being smaller than the second footprint area.

In step 1320, a conductive path may be formed between the sensor pixel circuit and one or more electrodes. The conductive path may be configured to electrically couple the receive electrode with a pixel input electrode of the sensor pixel circuit.

FIGS. 14A-14E illustrate an example of a process flow for fabricating an ultrasonic sensor pixel that includes a PMUT overlaid on a TFT substrate having TFT circuitry. Process flow 1400 may begin, at step S1401, with receiving a low-temperature polysilicon TFT substrate. In the illustrated example, the TFT substrate has been already provisioned with a desired arrangement of transistors and/or other semiconductor components, and interconnecting conductive material. For simplicity of illustration, in the illustrated example only two transistors, M1401 and M1402, are illustrated but it will be appreciated that a more complex arrangement of multiple transistors, diodes and capacitive elements may be contemplated by the presently disclosed techniques.

The process flow 1400 may continue at step S1402 with depositing an SiO2 planarization layer 1402*a*. Subsequent to deposition, the planarization layer 1402*a* may be planarized and patterned so as to selectively expose conductive pads and/or open vias (in the illustrated example at locations 1402*b*, 1402*c* and 1402*d*).

The process flow 1400 may continue at step S1403 with depositing and patterning a metal layer 1403*a* (e.g., a "redistribution layer") in a desired arrangement proximate, in the illustrated example, to locations 1402*b*, 1402*c* and 1402*d*.

The process flow 1400 may continue at step S1404 with depositing a layer 1404*a* of SiO2. The SiO2 layer 1404*a* may undergo a chemical mechanical polish (CMP) and planarization sequence subsequent to which amorphous silicon sacrificial layer 1404*b* may be deposited and patterned. The patterned amorphous silicon layer may be a sacrificial material intended to be removed in a subsequent step in order to form one or more cavities, vias and/or etch channels.

Figure 14A:
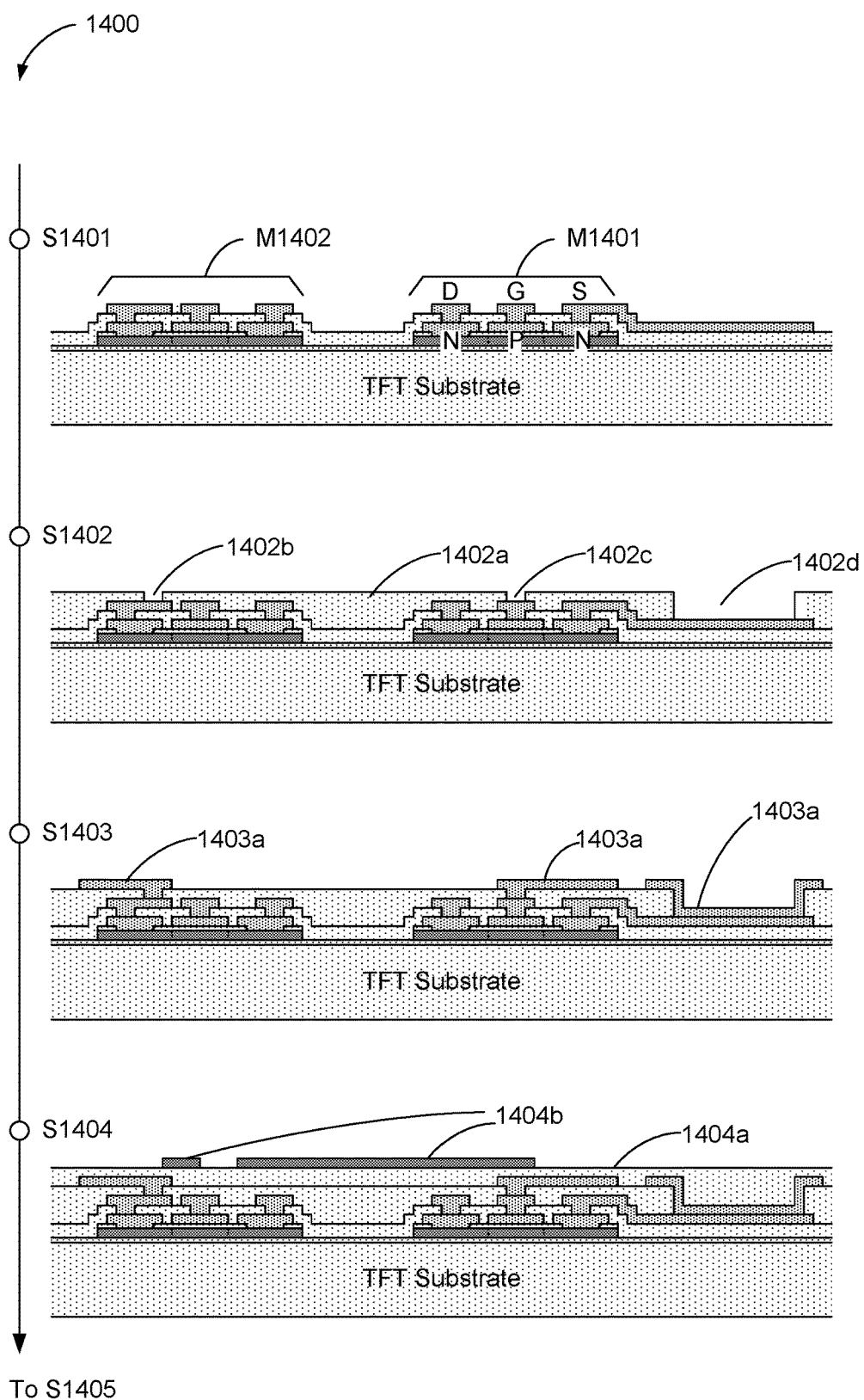
FIGS. 14A-14E illustrate an example of a process flow for fabricating an ultrasonic sensor pixel that includes a PMUT overlaid on a TFT substrate having TFT circuitry.
Figure 14B:
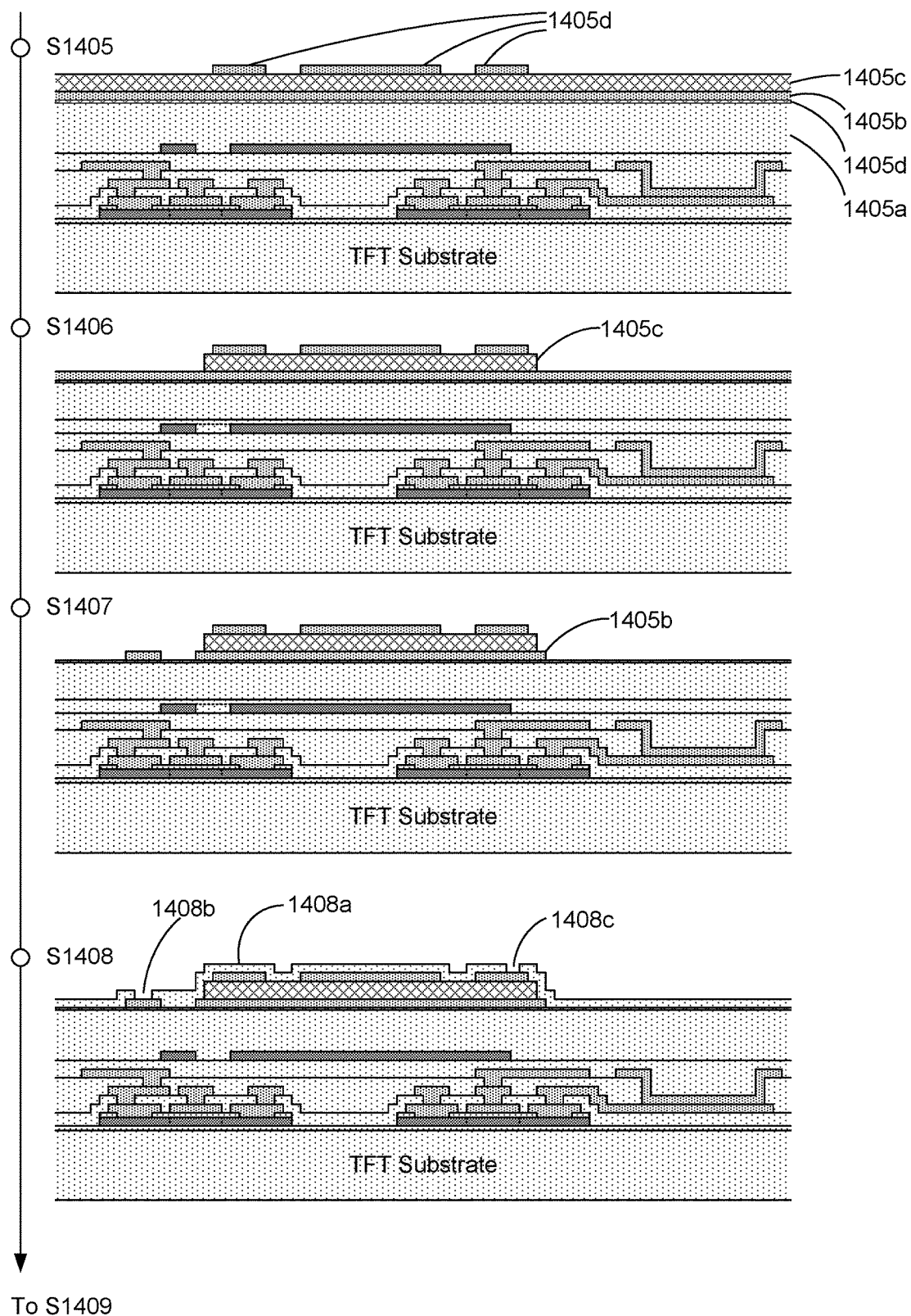

Referring now to FIG. 14B, the process flow 1400 may continue at step S1405. In the illustrated example, the step S1405 includes depositing a further layer 1405*a*. The layer 1405*a* may correspond to the mechanical layer 130 of FIG. 1A. The layer 1405*a* may include silicon dioxide (SiO$_2$), silicon oxynitride (SiON), silicon nitride (SiN), other dielectric material, or a combination of dielectric materials or layers. The layer 1405*a* may undergo a planarization process, following which a lower metal layer 1405*b* may be deposited. The lower metal layer 1405*b* may correspond to the lower electrode 112 of FIG. 1A. In the illustrated example, the step S1405 further includes depositing a piezoelectric layer 1405*c* of material such as aluminum nitride AlN, scandium-doped AlN, zinc oxide (ZnO), lead-zirconate titanate (PZT) or other suitable piezoelectric material. The piezoelectric layer 1405*c* may correspond to the piezoelectric layer 115 of FIG. 1A. In the illustrated example, the step S1405 further includes depositing and patterning an upper metal layer 1405*d*. The patterned upper metal layer 1405*d* may correspond to the upper electrode 114 of FIG. 1A. In some implementations, a seed layer 1405*d* such as a thin layer of AlN may be deposited prior to lower metal layer 1405*b*.

The process flow 1400 may continue at step S1406 with patterning and/or etching the piezoelectric layer 1405*c*. Etching of piezoelectric layer 1405*c* may include one or more dry or wet etch steps to selectively remove unwanted portions of the piezoelectric layer 1405*c* and stop on the underlying etch stop layer, such as lower metal layer 1405*b*.

The process flow 1400 may continue at step S1407 with patterning and/or etching the lower metal layer 1405*b*.

The process flow 1400 may continue at step S1408 with depositing a further dielectric layer 1408*a*. The layer 1408*a* may include SiO$_2$, SiON, SiN, other dielectric material, or a combination of dielectric materials or layers. In the illustrated example, the step S1408 includes patterning the dielectric layer 1408*a* so as to provide contact openings or vias, located (in the illustrated example) at locations 1408*b* and 1408*c*).

Figure 14C:
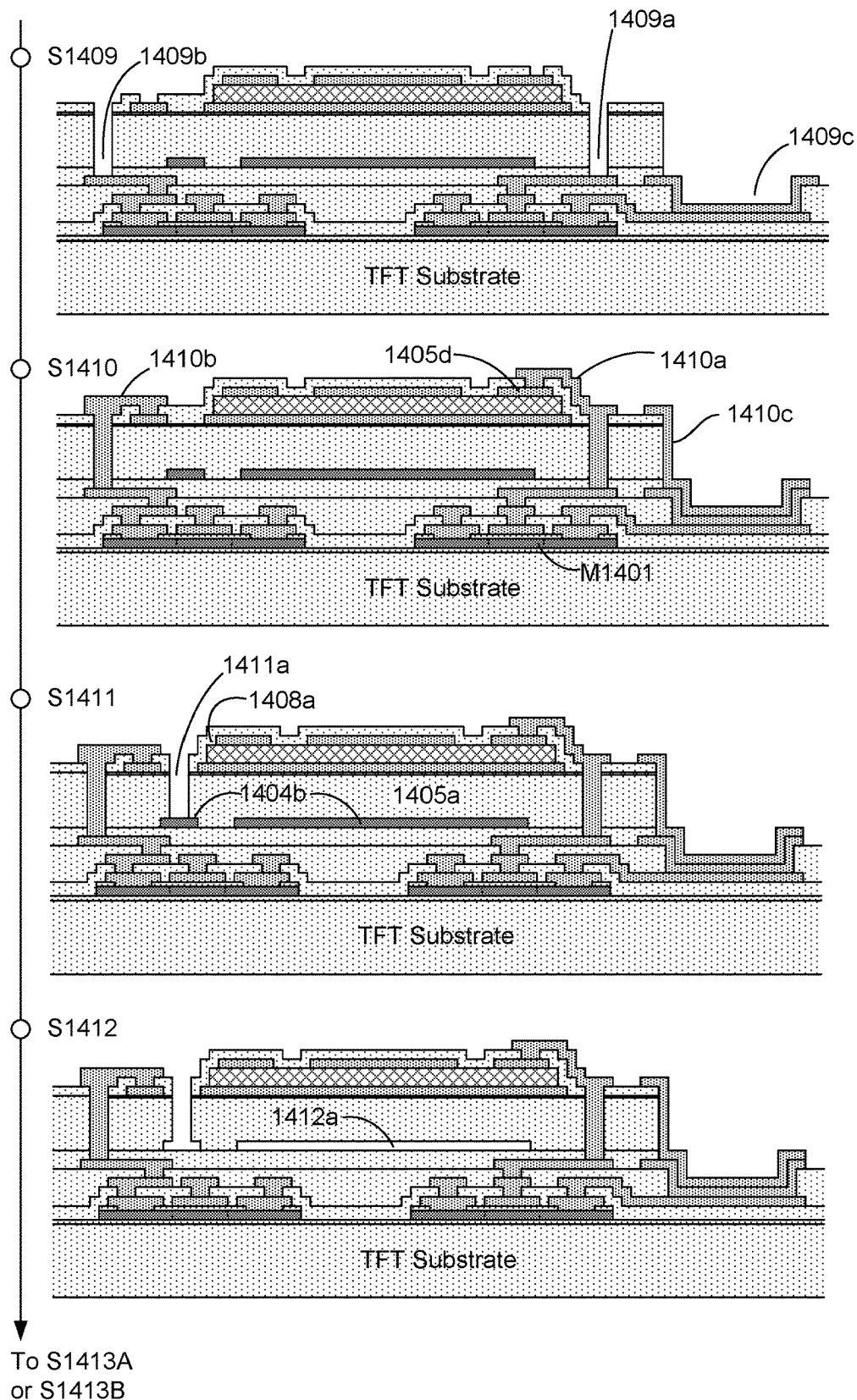

Referring now to FIG. 14C, the process flow 1400 may continue at step S1409. In the illustrated example, the step S1409 includes patterning and etching to form contact openings or via holes and expose conductive layers at locations 1409*a*, 1409*b*, and 1409*c*.

The process flow 1400 may continue at step S1410 with depositing, patterning and etching a metal layer proximal, in the illustrated example, to locations 1409*a*, 1409*b*, and 1409*c*. It may be observed that, as a result of these steps, a conductive path 1410*a* is formed that extends through location 1409*a*, and provides an electrical coupling between a gate terminal of transistor M1401 and upper metal layer 1405*d* (corresponding to the upper electrode 114 of FIG. 1A). Similarly, a conductive path 1410*b* may be formed that extends through location 1409*b* to fill or partially fill the contact openings and via holes, allowing electrical connections between patterned features on metal layer 1405*b* and patterned features on underlying interconnection layers associated with underlying TFT circuitry on the TFT substrate. For example, in some implementations, transistor M1402 may be used as a transistor driver for lower electrode 1405*b* corresponding to receiver bias electrode 539 and lower electrode 512 of PMUT 500 as shown in FIG. 5. Conductive path 1410*c* may be formed that extends through or over a sidewall of one or more dielectric layers to allow electrical connections between patterned features on metal layer 1405*b* and one or more bond pads on the TFT substrate. Alternatively, conductive path 1410*c* may be formed that allows electrical connections between patterned features on interconnection layers associated with TFT circuitry on the TFT substrate and one or more bond pads on the TFT substrate. Optionally, step S1410 may also include depositing, patterning and etching transparent conductors such as indium tin oxide over selected portions of the metal layer 1410*a*.

The process flow 1400 may continue at step S1411 with patterning and etching portions of layer 1405*a* and 1408*a* so as to form one or more sacrificial etch via holes 1411*a* that extends to amorphous silicon sacrificial layer 1404*b*.

The process flow 1400 may continue at step S1412 with removing (through, for example, via hole 1411*a*) the sacrificial amorphous silicon, such as with a suitably selective wet or dry etchant. In some implementations, xenon difluoride (XeF2) may be used to selectively remove the exposed portions of amorphous silicon sacrificial layer 1404*b*. The resulting cavity 1412*a* may correspond to the cavity 120 of FIG. 1A.

Figure 14D:
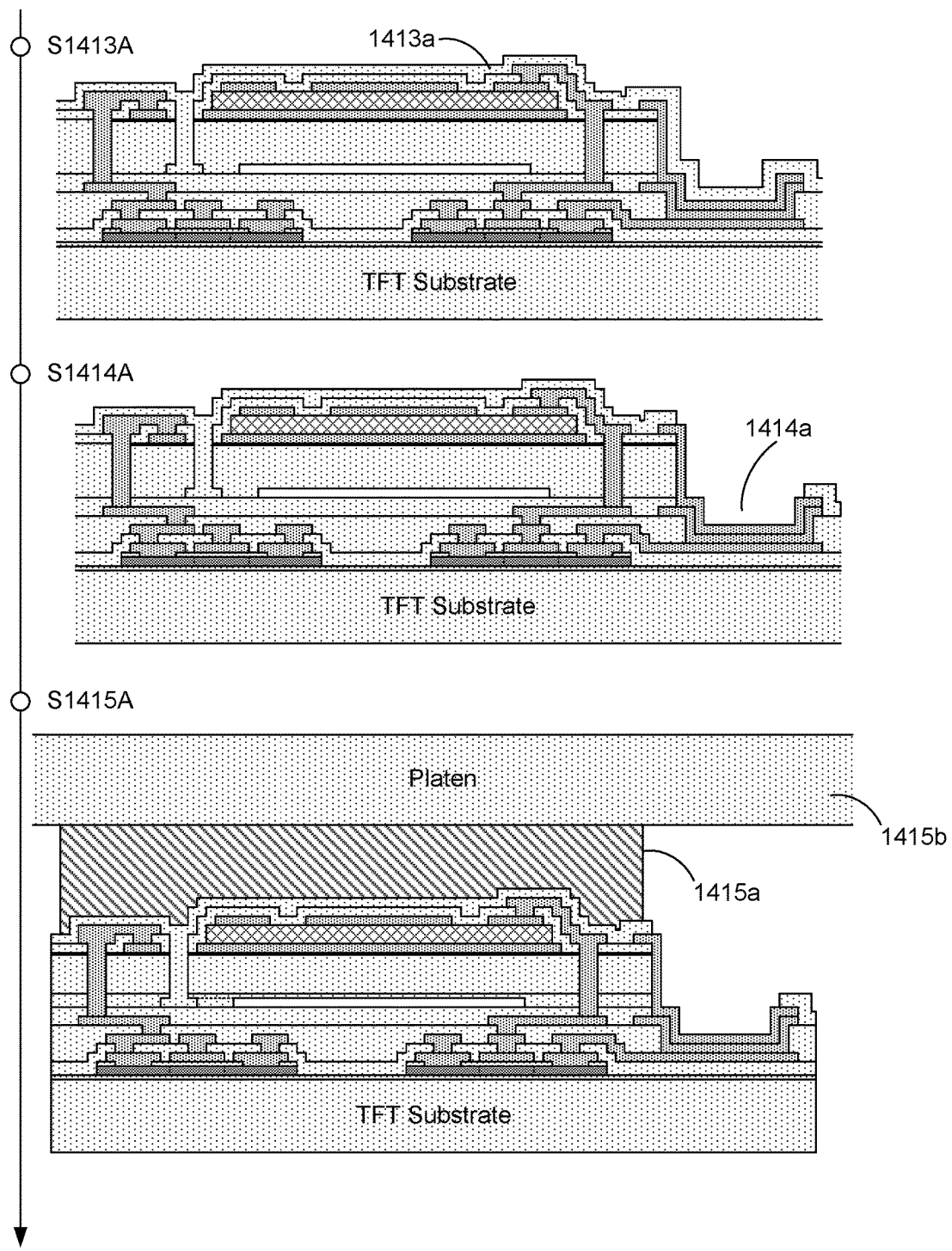

The remaining steps of process flow 1400 relate to encapsulation of the PMUT and installation of a coupling layer and platen. Two implementations of these process steps will be described. Referring first to FIG. 14D, in one implementation the process flow 1400 may continue at step S1413A with deposition of an encapsulation layer 1413*a*. The encapsulation layer 1413*a* may include one or more metal or dielectric layers, such as SiO2, SiON, SiN, ALD aluminum oxide (ALD AlOx) or other atomic layer deposited materials, or a composite layer of several such layers.

The encapsulation layer 1413a may then undergo patterning and etching (step S1414A) so as to expose one or more bond pads or other conductive features at, for example, location 1414a. In some implementations, the ALD AlOx layer or other suitable component of the encapsulation layer 1413a may serve as an etch stop layer when removing excess encapsulation layer material above the PMUT diaphragm(s) and simultaneously improve encapsulation layer effectiveness. The encapsulation layer may serve to seal and maintain a vacuum or other preferred pressure level within the PMUT cavity 1412a. The process flow 1400 may conclude at step S1415A with applying a coupling layer 1415a over the encapsulation layer 1413, and disposing a platen 1415b over the coupling layer 1415a. The coupling layer 1415a may allow transmission of ultrasonic waves generated or received by the underlying PMUT(s). In some implementations, the coupling layer 1415a may serve as an acoustic matching layer between the underlying PMUT(s) and the platen 1415b. In some implementations, the coupling layer 1415a may be a photo-imageable polymer, such as polyimide or a dry resist film. The photo-imageable polymer or other coupling layer materials may be patterned and etched to expose one or more bond pads disposed on the underlying TFT substrate such as location 1414a. In some implementations, the coupling layer 1415a may include one or more adhesive layers such as a pressure-sensitive adhesive (PSA) or a heat-curable or UV-curable epoxy.

Figure 14E:
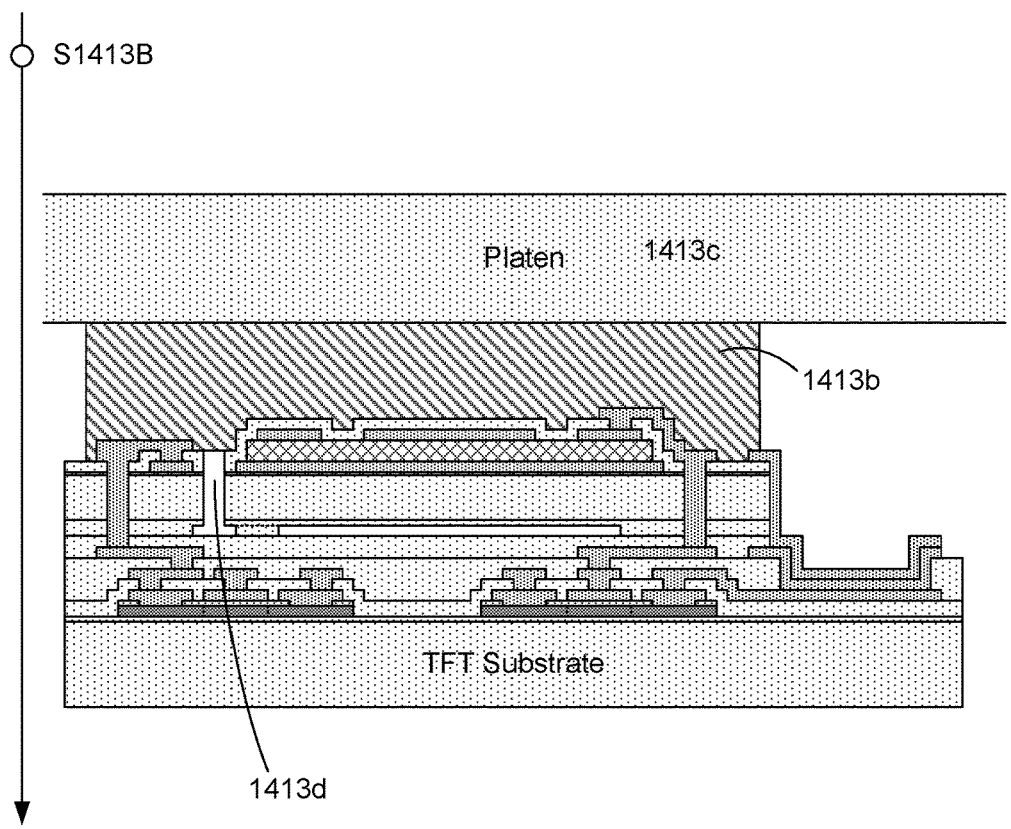

Referring next to FIG. 14E, in a second implementation, the process flow 1400 may continue at step S1413B (from step S1412) in which a single encapsulation/coupling layer 1413b is applied over the PMUT assembly illustrated in step S1412, and a platen 1413c is disposed over the encapsulation/coupling layer 1413b. It may be observed that, in the illustrated implementation, the single encapsulation/coupling layer 1413b seals but does not fill via 1413d, thereby encapsulating and sealing cavity 1412a while allowing acoustic coupling between the PMUT(s) and the platen 1413c.

Thus, an integrated PMUT pixel and readout have been disclosed. It will be appreciated that a number of alternative configurations and fabrication techniques may be contemplated. For example, the PMUT deformable diaphragm may be configured with a majority of the dielectric mechanical layer positioned above the piezoelectric layer stack further away from the cavity region (i.e. the mechanical layer 130 may be disposed over the piezoelectric layer stack 110 with the piezoelectric layer stack 110 proximate to the cavity 120).

As used herein, a phrase referring to "at least one of" a list of items refers to any combination of those items, including single members. As an example, "at least one of: a, b, or c" is intended to cover: a, b, c, a-b, a-c, b-c, and a-b-c.

The various illustrative logics, logical blocks, modules, circuits and algorithm processes described in connection with the implementations disclosed herein may be implemented as electronic hardware, computer software, or combinations of both. The interchangeability of hardware and software has been described generally, in terms of functionality, and illustrated in the various illustrative components, blocks, modules, circuits and processes described above. Whether such functionality is implemented in hardware or software depends upon the particular application and design constraints imposed on the overall system.

The hardware and data processing apparatus used to implement the various illustrative logics, logical blocks, modules and circuits described in connection with the aspects disclosed herein may be implemented or performed with a general purpose single- or multi-chip processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A general purpose processor may be a microprocessor or any conventional processor, controller, microcontroller, or state machine. A processor also may be implemented as a combination of computing devices, e.g., a combination of a DSP and a microprocessor, a plurality of microprocessors, one or more microprocessors in conjunction with a DSP core, or any other such configuration. In some implementations, particular processes and methods may be performed by circuitry that is specific to a given function.

In one or more aspects, the functions described may be implemented in hardware, digital electronic circuitry, computer software, firmware, including the structures disclosed in this specification and their structural equivalents thereof, or in any combination thereof. Implementations of the subject matter described in this specification also may be implemented as one or more computer programs, i.e., one or more modules of computer program instructions, encoded on a computer storage media for execution by or to control the operation of data processing apparatus.

If implemented in software, the functions may be stored on or transmitted over as one or more instructions or code on a computer-readable medium, such as a non-transitory medium. The processes of a method or algorithm disclosed herein may be implemented in a processor-executable software module which may reside on a computer-readable medium. Computer-readable media include both computer storage media and communication media including any medium that may be enabled to transfer a computer program from one place to another. Storage media may be any available media that may be accessed by a computer. By way of example, and not limitation, non-transitory media may include RAM, ROM, EEPROM, CD-ROM or other optical disk storage, magnetic disk storage or other magnetic storage devices, or any other medium that may be used to store desired program code in the form of instructions or data structures and that may be accessed by a computer. Also, any connection may be properly termed a computer-readable medium. Disk and disc, as used herein, includes compact disc (CD), laser disc, optical disc, digital versatile disc (DVD), floppy disk, and blu-ray disc where disks usually reproduce data magnetically, while discs reproduce data optically with lasers. Combinations of the above should also be included within the scope of computer-readable media. Additionally, the operations of a method or algorithm may reside as one or any combination or set of codes and instructions on a machine readable medium and computer-readable medium, which may be incorporated into a computer program product.

Various modifications to the implementations described in this disclosure may be readily apparent to those skilled in the art, and the generic principles defined herein may be applied to other implementations without departing from the spirit or scope of this disclosure. Thus, the claims are not intended to be limited to the implementations shown herein, but are to be accorded the widest scope consistent with this disclosure, the principles and the novel features disclosed herein. Additionally, as a person having ordinary skill in the art will readily appreciate, the terms "upper" and "lower", "top" and bottom", "front" and "back", and "over", "overlying", "on", "under" and "underlying" are sometimes used for ease of describing the figures and indicate relative positions corresponding to the orientation of the figure on a properly oriented page, and may not reflect the proper orientation of the device as implemented.

Certain features that are described in this specification in the context of separate implementations also may be implemented in combination in a single implementation. Conversely, various features that are described in the context of a single implementation also may be implemented in multiple implementations separately or in any suitable subcombination. Moreover, although features may be described above as acting in certain combinations and even initially claimed as such, one or more features from a claimed combination may in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed to achieve desirable results. Further, the drawings may schematically depict one more example processes in the form of a flow diagram. However, other operations that are not depicted may be incorporated in the example processes that are schematically illustrated. For example, one or more additional operations may be performed before, after, simultaneously, or between any of the illustrated operations. In certain circumstances, multitasking and parallel processing may be advantageous. Moreover, the separation of various system components in the implementations described above should not be understood as requiring such separation in all implementations, and it should be understood that the described program components and systems may generally be integrated together in a single software product or packaged into multiple software products. Additionally, other implementations are within the scope of the following claims. In some cases, the actions recited in the claims may be performed in a different order and still achieve desirable results.

What is claimed is:

1. An ultrasonic sensor pixel comprising:
   a substrate;
   a piezoelectric micromechanical ultrasonic transducer (PMUT) that includes a piezoelectric layer stack including a piezoelectric layer disposed over a cavity, the cavity being disposed between the piezoelectric layer stack and the substrate, a reference electrode disposed between the piezoelectric layer and the cavity, and a receive electrode and a transmit electrode disposed on a first surface of the piezoelectric layer, the first surface being opposite from the cavity; and
   a sensor pixel circuit electrically coupled the reference electrode, the receive electrode, and the transmit electrode, wherein
   the PMUT and the sensor pixel circuit are integrated with the sensor pixel circuit on the substrate.

2. The ultrasonic sensor pixel of claim 1, wherein the PMUT is configured to generate an ultrasonic wave when a transmitter excitation signal is applied to the transmit electrode.

3. The ultrasonic sensor pixel of claim 1, wherein the sensor pixel circuit is configured to generate a pixel output signal indicating a strength or magnitude of a reflected ultrasonic pressure wave impinging on the PMUT.

4. The ultrasonic sensor pixel of claim 1, wherein the sensor pixel circuit includes a diode and a readout transistor and at least one of a peak detector, a peak-to-peak detector, a sample-and-hold circuit, an envelope detector, and a charge integrator.

5. The ultrasonic sensor pixel of claim 4, wherein the diode is configured to be biased using a bias signal, such that the diode operates in a peak-detecting mode of operation or a rectification mode of operation.

6. The ultrasonic sensor pixel of claim 5, wherein the bias signal corresponds to a receiver bias voltage or a diode bias voltage, the bias signal being applied to the reference electrode, the transmit electrode, or a terminal of the diode.

7. The ultrasonic sensor pixel of claim 5, wherein the bias signal includes multiple levels of temporally separated bias voltages.

8. The ultrasonic sensor pixel of claim 7, wherein each of the multiple levels of temporally separated bias voltages corresponds to a respective one of a hold value, a block value, and a sample value.

9. The ultrasonic sensor pixel of claim 8, wherein one of the multiple levels of temporally separated bias voltages corresponds to the sample value, the sample value being held for a duration corresponding to an acquisition time window to detect a reflected ultrasonic wave.

10. The ultrasonic sensor pixel of claim 9, wherein the duration is substantially shorter than the period of one cycle of a transmitter excitation signal.

11. The ultrasonic sensor pixel of claim 7, wherein each of the multiple levels of temporally separated bias voltages corresponds to a respective one of a hold value and a sample value.

12. The ultrasonic sensor pixel of claim 1, wherein the substrate includes one or more of a silicon wafer, a silicon-on-insulator (SOI) wafer, a silicon or SOI wafer with integrated circuitry, a semiconductor substrate, and a glass or polymer substrate with thin film transistor (TFT) circuitry.

13. The ultrasonic sensor pixel of claim 1, wherein the sensor pixel circuit includes thin-film transistor (TFT) circuitry or CMOS circuitry that is co-fabricated with the PMUT on the substrate.

14. The ultrasonic sensor pixel of claim 1, wherein the PMUT overlays the sensor pixel circuit, such that the PMUT and the sensor pixel circuit are contained within a common footprint area.

15. The ultrasonic sensor pixel of claim 1, wherein the sensor pixel circuit is contained within a first footprint area, the PMUT is contained within a second footprint area, and the first footprint area is smaller than the second footprint area.

16. An ultrasonic sensor array comprising:
    a substrate; and
    a plurality of ultrasonic sensor pixels, each sensor pixel including a piezoelectric micromechanical ultrasonic transducer (PMUT); wherein
       each PMUT includes a receive electrode and a transmit electrode, wherein the receive electrode and transmit electrode are disposed on a piezoelectric layer; and
       wherein each ultrasonic sensor pixel includes a respective sensor pixel circuit, disposed on the substrate beneath the PMUT, and electrically coupled with the PMUT.

17. The ultrasonic sensor array of claim 16, wherein each PMUT includes a piezoelectric layer stack including the piezoelectric layer disposed over a cavity, the cavity being disposed between the piezoelectric layer stack and the substrate, a reference electrode disposed between the piezoelectric layer and the cavity, and one or both of a receive electrode and a transmit electrode disposed on or proximate to a first surface of the piezoelectric layer, the first surface being opposite from the cavity.

18. The ultrasonic sensor array of claim 16, wherein a transmitter excitation signal is applied to a transmit electrode of a plurality of PMUTs in the ultrasonic sensor array to generate a substantially plane ultrasonic wave.

19. The ultrasonic sensor array of claim 16, wherein a plurality of transmitter excitation signals are applied to some or all of the PMUTs in the ultrasonic sensor array to generate a beamformed ultrasonic wave.

20. The ultrasonic sensor array of claim 16, wherein each sensor pixel circuit is configured to provide a pixel output signal representing a local magnitude of a reflected portion of an ultrasonic wave at a selected time after launching the ultrasonic wave from the ultrasonic sensor array.

21. The ultrasonic sensor array of claim 16, wherein each respective sensor pixel circuit includes a diode bias driver terminal, a reset terminal and a read driver terminal.

22. The ultrasonic sensor array of claim 21, further comprising a sensor controller configured to selectively initiate a transmit mode of operation, a receive mode of operation, and a read mode of operation at the ultrasonic sensor array by signaling one or more of a receiver bias electrode, the diode bias driver terminal, the reset terminal, and the read driver terminal.

23. A method of making an ultrasonic sensor pixel, the method comprising:
    forming a piezoelectric micromechanical ultrasonic transducer (PMUT) over a substrate, the substrate including a sensor pixel circuit, the PMUT including a piezoelectric layer stack including a piezoelectric layer disposed over a cavity, a reference electrode disposed between the piezoelectric layer stack and the cavity, and a receive electrode and a transmit electrode disposed on a first surface of the piezoelectric layer stack, the first surface being opposite from the cavity; and
    forming a conductive path between the sensor pixel circuit and the reference electrode, the receive electrode and the transmit electrode.

24. The method of claim 23, wherein the sensor pixel circuit includes a pixel input electrode, and the conductive path electrically couples the receive electrode with the pixel input electrode.

25. The method of claim 23, wherein the sensor pixel circuit includes a diode and a readout transistor.

26. The method of claim 25, wherein the diode is configured to be biased using a bias signal, such that the diode operates in a peak-detecting mode of operation or a rectification mode of operation.

27. The method of claim 23, wherein the PMUT overlays the sensor pixel circuit, such that the PMUT and the sensor pixel circuit are contained within a common footprint area.

28. The method of claim 23, wherein the sensor pixel circuit is contained within a first footprint area, the PMUT is contained within a second footprint area, and the first footprint area is smaller than the second footprint area.

29. An apparatus comprising:
    a substrate;
    a piezoelectric micromechanical ultrasonic transducer (PMUT) that includes a piezoelectric layer stack including a piezoelectric layer disposed over a cavity, the cavity being disposed between the piezoelectric layer stack and the substrate, a reference electrode disposed between the piezoelectric layer and the cavity, and a receive electrode and a transmit electrode disposed on or proximate to a first surface of the piezoelectric layer, the first surface being opposite from the cavity;
    a sensor pixel circuit electrically coupled with the PMUT; and
    means, electrically coupled with the PMUT and integrated with the PMUT on the substrate, for generating a pixel output signal indicating a strength or magnitude of a reflected ultrasonic wave impinging on the PMUT.

30. The apparatus of claim 29, wherein the substrate includes one or more of a silicon wafer, a silicon-on-insulator (SOI) wafer, a silicon or SOI wafer with integrated circuitry, a semiconductor substrate, and a glass or polymer substrate with thin film transistor (TFT) circuitry.

* * * * *